US008435594B2

(12) United States Patent
Konishiike et al.

(10) Patent No.: US 8,435,594 B2
(45) Date of Patent: May 7, 2013

(54) EVAPORATION APPARATUS, METHOD OF MANUFACTURING ANODE USING SAME, AND METHOD OF MANUFACTURING BATTERY USING SAME

(75) Inventors: Isamu Konishiike, Fukushima (JP); Chisato Okina, Miyagi (JP); Keisuke Tanabe, Miyagi (JP); Atsuhiro Abe, Miyagi (JP); Hidetoshi Nishiyama, Miyagi (JP); Kenichi Kawase, Fukushima (JP); Shunsuke Kurasawa, Fukushima (JP); Koichi Matsumoto, Fukushima (JP)

(73) Assignee: Sony Corporation, Tokyo (JP)

( * ) Notice: Subject to any disclaimer, the term of this patent is extended or adjusted under 35 U.S.C. 154(b) by 869 days.

(21) Appl. No.: 12/197,731

(22) Filed: Aug. 25, 2008

(65) Prior Publication Data
US 2009/0061079 A1 Mar. 5, 2009

(30) Foreign Application Priority Data
Sep. 5, 2007 (JP) .................................. 2007-229850

(51) Int. Cl.
B05D 5/12 (2006.01)
C23C 14/00 (2006.01)

(52) U.S. Cl.
USPC ............ 427/115; 427/78; 427/98.4; 427/124; 427/282; 427/424

(58) Field of Classification Search .................... 427/78, 427/98.4, 115, 124, 282, 424; 118/718
See application file for complete search history.

(56) References Cited

U.S. PATENT DOCUMENTS

| 3,796,882 | A | * | 3/1974 | Cahill et al. ................... 257/184 |
| 5,151,379 | A | * | 9/1992 | Suginoya et al. ............. 427/529 |
| 5,525,158 | A | * | 6/1996 | Tsukazaki et al. ...... 118/723 CB |
| 5,803,976 | A | * | 9/1998 | Baxter et al. ................... 118/726 |
| 6,649,033 | B2 | * | 11/2003 | Yagi et al. ................ 204/192.23 |
| 7,780,876 | B2 | * | 8/2010 | Nakatani ....................... 252/512 |
| 7,914,930 | B2 | * | 3/2011 | Sato et al. ................ 429/231.95 |
| 2002/0155632 | A1 | * | 10/2002 | Yamazaki et al. .............. 438/29 |
| 2006/0062900 | A1 | * | 3/2006 | Selvamanickam .............. 427/62 |
| 2008/0020271 | A1 | * | 1/2008 | Sato et al. ..................... 429/129 |

FOREIGN PATENT DOCUMENTS

| JP | 62080263 | A | * | 4/1987 |
| JP | 06-170218 | | | 6/1994 |
| JP | 6-309665 | | | 11/1994 |
| JP | 2000-234163 | | | 8/2000 |

(Continued)

OTHER PUBLICATIONS

Office Action in Japanese Patent Application No. 2007-229850, issued Oct. 20, 2011.

Primary Examiner — Brian K Talbot
(74) Attorney, Agent, or Firm — Oblon, Spivak, McClelland, Maier & Neustadt, L.L.P.

(57) ABSTRACT

An evaporation apparatus that is capable of stably forming a good quality thin film and is highly suitable for mass production is provided. The evaporation apparatus include an evaporation source discharging an evaporation material by heating, a retention member retaining an evaporation object, and a heat shield member that is located between the evaporation source and the evaporation object retained by the retention member, has an opening for passing the evaporation material in a state of vapor phase from the evaporation source to the evaporation object, and shields the evaporation object from part of radiation heat of the evaporation source. The heat shield member is located closer to the evaporation source than to the retention member.

11 Claims, 14 Drawing Sheets

FOREIGN PATENT DOCUMENTS

| | | |
|---|---|---|
| JP | 2003-007464 | 1/2003 |
| JP | 2004-349162 | 12/2004 |
| JP | 2005-091345 | 4/2005 |
| JP | 2005-158633 | 6/2005 |
| JP | 2006-207022 | 8/2006 |
| JP | 2008-130427 | 6/2008 |

* cited by examiner

EXAMPLE 1

COMPARATIVE EXAMPLE 1

401  402

COMPARATIVE EXAMPLE 2

301

COMPARATIVE EXAMPLE 3

EVAPORATION APPARATUS, METHOD OF MANUFACTURING ANODE USING SAME, AND METHOD OF MANUFACTURING BATTERY USING SAME

CROSS REFERENCES TO RELATED APPLICATIONS

The present invention contains subject matter related to Japanese Patent Application JP 2007-229850 filed in the Japanese Patent Office on Sep. 5, 2007, the entire contents of which being incorporated herein by reference.

BACKGROUND OF THE INVENTION

1. Field of the Invention

The present invention relates to an evaporation apparatus for evaporating an evaporation material sublimated from an evaporation source to an evaporation object, a method of manufacturing an anode using the same, and a method of manufacturing a battery using the same.

2. Description of the Related Art

In recent years, high performance and multifunction of mobile devices have been developed. Accordingly, for secondary batteries as a power source for the mobile devices, it is demanded to achieve their high capacity. Lithium ion secondary batteries satisfy such a demand. Recently, the lithium ion secondary batteries having an extremely high capacity have been developed by using silicon (Si) and tin (Sn) as an anode active material.

However, in the anode active material using silicon, tin and the like, the expansion and shrinkage due to charge and discharge are significant. Thus, it is often the case that the lowering of the cycle characteristics due to pulverization becomes an issue. Thus, the applicants of the invention have proposed the following technique. In the technique, the anode active material is formed by using vapor-phase deposition method or the like. Thereby, the pulverization is inhibited, and the current collector and the active material layer are unified to obtain extremely favorable electron conductivity in the anode (for example, refer to Japanese Unexamined Patent Application Publication No. 2004-349162). In such an anode and a battery including such an anode, high performance is expected for both the capacity and the cycle life.

As the vapor-phase deposition method, for example, Physical Vapor Deposition (PVD) method such as vacuum evaporation method in which a target (evaporation source) is heated, volatilized, and evaporated; sputtering method in which inert gas is turned into plasma by glow discharge or high frequency, and thereby a target is in a state of sputtering; and ion plating method in which a substrate is in a state of high potential, and an ionized target is deposited on the substrate is known. In addition, Chemical Vapor Deposition (CVD) method is also known. Of the foregoing, in the sputtering method, though the film thickness is able to be delicately adjusted, the deposition rate is slow and thus there is an issue in mass production. In the ion plating method, there is an issue that since the temperature of the substrate as the evaporation object is increased, and thus the substrate material is limited. In the CVD method, it is more disadvantageous than the foregoing PVD method in terms of mass production. Accordingly, when the anode active material is formed on the anode current collector, the vacuum evaporation method is suitable. In the method, relatively high production efficiency is obtainable and high quality is easily ensured. In general, in the vacuum evaporation method, the following procedure is made. That is, an evaporation material is physically heated and melted by an electron beam and a resistive element, part thereof is sublimated and deposited on the surface of the evaporation target. Thereby, a thin film made of a desired material is formed.

SUMMARY OF THE INVENTION

In the case where the anode active material is formed on the anode current collector by using the vacuum evaporation method, to improve the production efficiency by depositing more anode active materials in a shorter time, it is necessary to keep the evaporation source at higher temperature. However, when the temperature of the evaporation source is increased excessively, the anode current collector as an evaporation object is heated by radiation heat of the evaporation source to cause disadvantages as follows. That is, the anode current collector may be melted, or an undesirable intermetallic compound is generated due to alloying reaction with the anode active material.

In view of the foregoing, in the invention, firstly, it is desirable to provide an evaporation apparatus that can stably form a good quality thin film, and is highly suitable for mass production. In the invention, secondly, it is desirable to provide a method of manufacturing an anode using such an evaporation apparatus and a method of manufacturing a battery using such an evaporation apparatus.

According to an embodiment of the invention, there is provided an evaporation apparatus including an evaporation source discharging an evaporation material by heating, a retention member retaining an evaporation object, and a heat shield member that is located between the evaporation source and the evaporation object retained by the retention member, has an opening for passing the evaporation material in a state of vapor phase from the evaporation source to the evaporation object, and shields the evaporation object from part of radiation heat of the evaporation source. The heat shield member is located closer to the evaporation source than to the retention member.

In the evaporation apparatus of the embodiment of the invention, the heat shield member is provided closer to the evaporation source than to the retention member between the evaporation source and the evaporation object. Thus, when evaporation treatment is performed, radiation heat of the evaporation source to the evaporation object is decreased, and temperature rise of the evaporation object itself is inhibited.

According to an embodiment of the invention, there is provided a method of manufacturing an anode in which an active material layer is provided on a current collector. The method includes the steps of retaining the current collector in a location where the current collector is opposed to an evaporation source discharging an active material by heating, and forming the active material layer by sublimating the active material from the evaporation source after arranging a heat shield member having an opening in a location closer to the evaporation source than to the current collector between the evaporation source and the current collector, and depositing the active material in a vapor phase passing through the opening on the current collector while blocking part of radiation heat of the evaporation source by the heat shield member.

According to an embodiment of the invention, there is provided a method of manufacturing a battery. The method includes the steps of respectively forming a cathode and an anode, and containing a laminated structure having the cathode, the anode, and a separator sandwiched between the cathode and the anode into a package member together with an electrolyte. The step of forming the anode includes the steps of retaining a current collector in a location where the current collector is opposed to an evaporation source discharging an active material by heating, and forming an active material layer by sublimating the active material from the evaporation source after arranging a heat shield member having an opening in a location closer to the evaporation source than to the current collector between the evaporation source and the current collector, and depositing the active material in a vapor phase passing through the opening on the current collector while blocking part of radiation heat of the evaporation source by the heat shield member.

In the method of manufacturing an anode and the method of manufacturing a battery according to the embodiments of the invention, when the active material layer is formed on the current collector, the active material in a vapor phase passing through the opening is evaporated on the current collector while part of radiation heat of the evaporation source is blocked by the heat shield member provided in the location closer to the evaporation source. Thus, radiation heat of the evaporation source to the current collector is decreased, and temperature rise of the current collector itself is inhibited.

According to the evaporation apparatus of the embodiment of the invention, the heat shield member is provided closer to the evaporation source than to the retention member between the evaporation source and the evaporation object. In addition, when evaporation treatment is performed, radiation heat of the evaporation source to the evaporation object is decreased. Thus, excessive temperature rise of the evaporation object itself is inhibited. Thus, alteration of the evaporation material deposited on the evaporation object and unnecessary side reaction with the evaporation object are easily avoided. Therefore, by using the evaporation apparatus, while the quality of the thin film formed on the evaporation object is maintained, the vaporization amount from the evaporation source per unit time is increased, and it is advantageous to improvement of production efficiency.

According to the method of manufacturing an anode of the embodiment of the invention, by using the heat shield member arranged close to the evaporation source between the evaporation source and the current collector, radiation heat of the evaporation source to the current collector is decreased, and excessive temperature rise of the current collector itself is avoided. Thus, generation of unnecessary products due to side reaction between the component material of the current collector and the active material is inhibited, and the anode including the active material layer having a homogenized and good quality crystal structure is manufactured.

According to the method of manufacturing a battery of the embodiment of the invention, the anode is manufactured as above. Thus, the cycle characteristics are improved.

Other and further objects, features and advantages of the invention will appear more fully from the following description.

DETAILED DESCRIPTION OF THE PREFERRED EMBODIMENT

An embodiment of the invention will be hereinafter described in detail with reference to the drawings.

Figure 1:
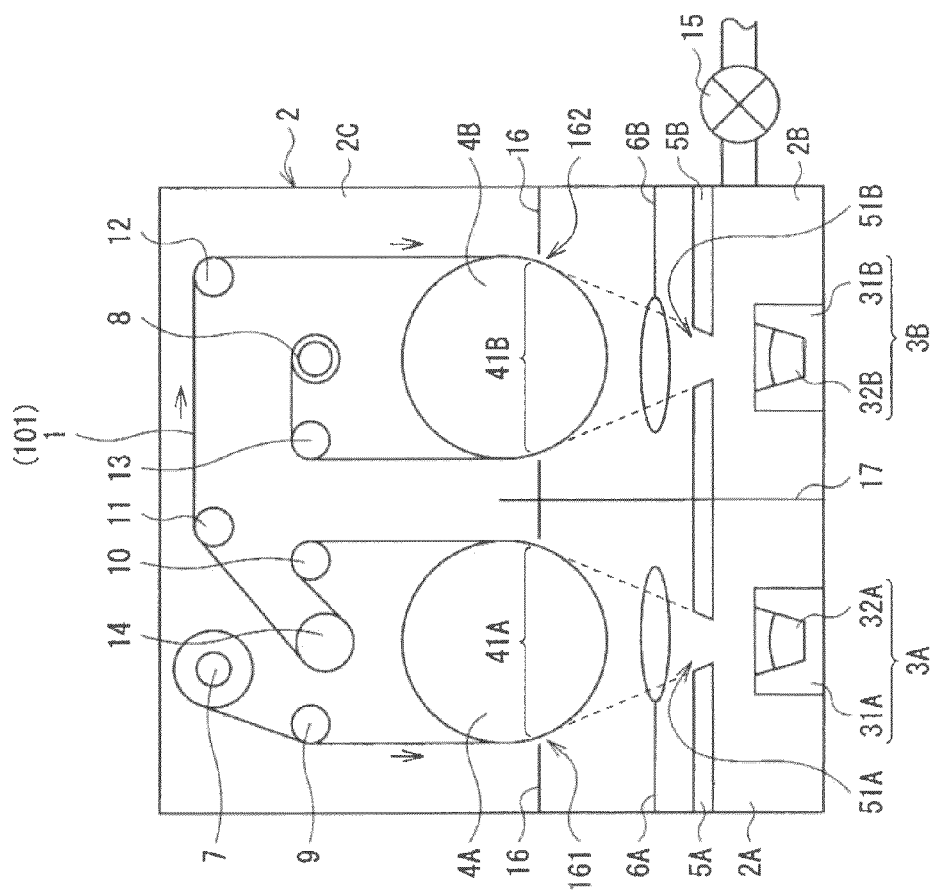
FIG. 1 is a schematic view showing a configuration of an evaporation apparatus as an embodiment of the invention.

FIG. 1 is a schematic view showing a configuration of an electron beam evaporation apparatus (hereinafter simply referred to as evaporation apparatus) as an embodiment of the invention. In the evaporation apparatus, as will be described later, evaporation materials 32A and 32B contained in crucibles 31A and 31B are evaporated and deposited on the surface of an evaporation object 1 made of a strip-shaped metal foil or the like retained by can rolls 4A and 4B, and thereby a thin film is formed.

The evaporation apparatus includes evaporation sources 3A and 3B, the can rolls (deposition rolls) 4A and 4B, a heat shield plate 5, shutters 6A and 6B, wind-up rollers 7 and 8, guide rollers 9 to 13, and a feed roller 14 in an evaporation treatment bath 2. Outside the evaporation treatment bath 2, a vacuum air exhaust 15 is provided.

The evaporation treatment bath 2 is segmented into evaporation source installation chambers 2A and 2B and an evaporation object running chamber 2C by a division plate 16. The evaporation source installation chamber 2A and the evaporation source installation chamber 2B are separated by a division wall 17. In the evaporation source installation chamber 2A, a heat shield plate 5A and the shutter 6A are installed in addition to the evaporation source 3A. In the other evaporation source installation chamber 2B, a heat shield plate 5B and the shutter 6B are installed in addition to the evaporation source 3B. For the details of the evaporation sources 3A and 3B, the heat shield plates 5A and 5B, and the shutters 6A and 6B, a description will be given later.

In the evaporation object running chamber 2C, the can rolls 4A and 4B are respectively installed above the evaporation sources 3A and 3B. However, the division plate 16 is provided with openings 161 and 162 in two locations corresponding to the can rolls 4A and 4B, and part of the can rolls 4A and 4B is projected into the evaporation source installation chambers 2A and 2B. In the evaporation object running chamber 2C, as a means for retaining and running the evaporation object 1 in the longitudinal direction, the wind-up rollers 7 and 8, the guide rollers 9 to 13, and the feed roller 14 are respectively arranged in given positions.

The evaporation object 1 is in a state that its one end side is wound up by the wind-up roller 7, and the other end side is attached to the wind-up roller 8 through the guide roller 9, the can roll 4A, the guide roller 10, the feed roller 14, the guide roller 11, the guide roller 12, the can roll 14B, and the guide roller 13 in this order from the wind-up roller 7. The evaporation object 1 is arranged to be contacted with each outer circumferential plane of the wind-up rollers 7 and 8, the guide rollers 9 to 13, and the feed roller 14. One face (front face) of the evaporation object 1 is contacted with the can roll 4A, and the other face (rear face) is contacted with the can roll 4B. The wind-up rollers 7 and 8 are drive system. Thus, the evaporation object 1 may be sequentially conveyed from the wind-up roller 7 to the wind-up roller 8, and may be sequentially conveyed from the wind-up roller 8 to the wind-up roller 7 as well. FIG. 1 shows a state that the evaporation object 1 runs from the wind-up roller 7 to the wind-up roller 8, and arrows in the figure indicate the traveling direction of the evaporation object 1. Further, in the evaporation apparatus, the feed roller 14 is also a drive system.

The can rolls 4A and 4B are a rotating body (drum) in the shape of a cylinder or the like for retaining the evaporation object 1. The can rolls 4A and 4B rotate (rotate on its axis) and thereby part of the outer circumferential plane sequentially enters the evaporation source installation chambers 2A and 2B to oppose the evaporation sources 3A and 3B. Then, of the outer circumferential plane of the can rolls 4A and 4B, parts 41A and 41B entering the evaporation source installation chambers 2A and 2B become evaporation regions where the thin film is formed from the evaporation materials 32A and 32B from the evaporation sources 3A and 3B.

In the evaporation sources 3A and 3B, the evaporation materials 32A and 32B are contained in the crucibles 31A and 31B. The evaporation materials 32A and 32B are heated and thereby evaporated (vaporized). Specifically, the evaporation sources 3A and 3B further include, for example, an electron gun (not shown). A thermal electron emitted by driving the electron gun is irradiated to the evaporation materials 32A and 32B contained in the crucibles 31A and 31B, while the range thereof is electromagnetically controlled by, for example, a deflection yoke (not shown). The evaporation materials 32A and 32B are heated by irradiation of the thermal electron from the electron gun, melted, and then gradually evaporated.

The crucibles 31A and 31B are made of, for example, an oxide such as titanium oxide, tantalum oxide, zirconium oxide, and silicon oxide in addition to carbon. To protect the crucibles 31A and 31B from excessive temperature rise due to irradiation of the thermal electron to the evaporation materials 32A and 32B, part of the surroundings of the crucibles 31A and 31B (for example, the bottom face) may be contacted with a cooling system (not shown). As the cooling system, for example, a water-cooling system such as a water jacket is suitable.

The shutters 6A and 6B are an openable and closable mechanism that is arranged between the evaporation sources 3A and 3B and the can rolls 4A and 4B, and controls passing of the vapor-phase evaporation materials 32A and 32B from the crucibles 31A and 31B to the evaporation object 1 retained by the can rolls 4A and 4B. That is, in the evaporation treatment, the shutters 6A and 6B are opened to allow the vapor-phase evaporation materials 32A and 32B evaporated from the crucibles 31A and 31B to pass. Meanwhile, before and after the evaporation treatment, the shutters 6A and 6B block passing of the vapor-phase evaporation materials 32A and 32B. The shutters 6A and 6B are connected to a control circuit system (not shown). When a command signal to open or close the shutters 6A and 6B is inputted, the shutters 6A and 6B are driven.

The heat shield plates 5A and 5B are made of, for example, a metal material such as copper, and are arranged closer to the evaporation sources 3A and 3B than to the can rolls 4A and 4B between the evaporation sources 3A and 3B and the can rolls 4A and 4B. The heat shield plates 5A and 5B function to decrease radiation heat of the evaporation sources 3A and 3B to the evaporation object 1. The heat shield plates 5A and 5B may be arranged between the shutters 6A and 6B and the can rolls 4A and 4B. However, as shown in FIG. 1, the heat shield plates 5A and 5B are more preferably arranged between the evaporation sources 3A and 3B and the shutters 6A and 6B, since thereby radiation heat to the shutters 6A and 6B is also decreased. The heat shield plates 5A and 5B are provided with openings 51A and 52B in locations corresponding to the evaporation materials 32A and 32B contained in the crucibles 31A and 31B and the shutters 6A and 6B. The openings 51A and 51B allow the vapor-phase evaporation materials 32A and 32B evaporated from the evaporation sources 3A and 3B to the evaporation object 1 to pass. As a material composing the heat shield plates 5A and 5B, stainless steel, iron, nickel or the like may be also used in addition to copper.

Figure 2A:
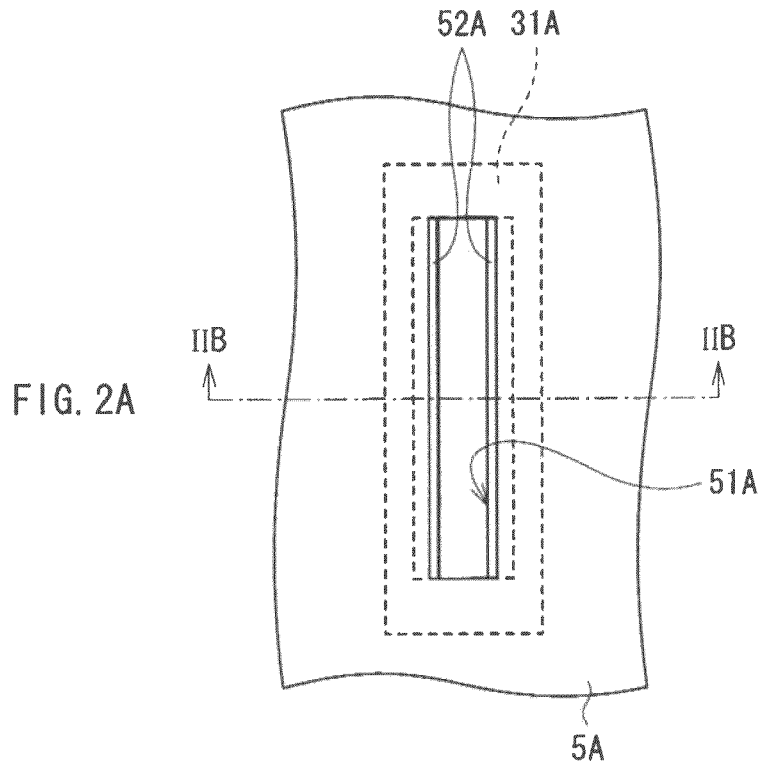
FIGS. 2A and 2B are an enlarged top view and an enlarged cross section view of a main part of the evaporation apparatus shown in FIG. 1.
Figure 2B:
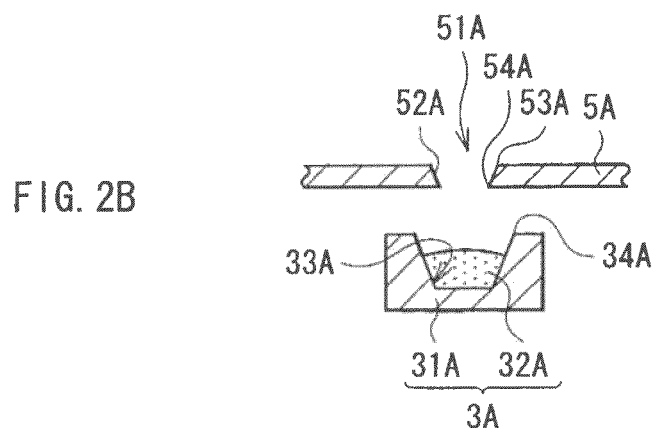

The heat shield plates 5A and 5B are arranged, for example, to block the entire crucibles 31A and 31B from the evaporation object 1 and to also block part of the evaporation materials 32A and 32B contained in the crucibles 31A and 31B from the evaporation object 1. FIGS. 2A and 2B are enlarged views showing a position relation between the crucible 31A and the heat shield plate 5A. FIG. 2A is a plan view seen from the can roll 4A. FIG. 2B is a cross section view taken along section line IIB-IIB shown in FIG. 2A. As shown in FIGS. 2A and 2B, in the horizontal plane, the area occupied by the opening 51A is smaller than the area surrounded by an upper edge 34A of a depressed portion 33A of the crucible 31A. With this structure, radiation heat of the crucibles 31A and 31B and the evaporation materials 32A and 32B as a heat generation source to the evaporation object 1 is more decreased. An end face 52A of the opening 51A is tilted to be expanded from the crucible 31A side to the can roll 4A (evaporation object 1) side. That is, the area surrounded by a lower edge 54A is smaller than the area surrounded by an upper edge 53A of the opening 51A. Due to such a structure, even when the area occupied by the opening 51A (area surrounded by the lower edge 54A) is reduced to make more radiation heat be absorbed into the heat shield plates 5A and 5B, it is not necessary to reduce the amount of the evaporation material 32A that passes the opening 51A and reaches the can roll 4A (evaporation object 1). The position relation between the crucible 31B and the shield 5B is similar to this position relation, and thus similar effects are also obtained.

The heat shield plates 5A and 5B further include a water channel through which cooling water is circulated. Thereby, the temperature of the heat shield plates 5A and 5B themselves are prevented from being increased due to the radiation heat of the evaporation sources 3A and 3B. Accordingly, adverse effect on the evaporation object 1 is avoided. The heat shield plates 5A and 5B are desirably arranged not to be directly contacted with the crucibles 31A and 31B, but to be arranged with a given distance (for example, 30 mm) from the upper end of the crucibles 31A and 31B. If the heat shield plates 5A and 5B are directly contacted with the crucibles 31A and 31B, the heat shield plates 5A and 5B are heated to become a generation source of radiation heat. It is conceivable that generation of the radiation heat is inhibited by cooling the heat shield plates 5A and 5B. However, in this case, temperature of the crucibles 31A and 31B contacted with the heat shield plates 5A and 5B are also lowered, and thus sufficient transpiration rate of the evaporation materials 32A and 32B is not obtained. Therefore, as described above, by arranging the heat shield plates 5A and 5B with a given distance from the crucibles 31A and 31B, the radiation heat to the evaporation object 1 is blocked without affecting the temperature of the crucibles 31A and 31B.

As described above, according to the evaporation apparatus as this embodiment, the heat shield plates 5A and 5B are provided between the evaporation sources 3A and 3B that discharge the vapor-phase evaporation materials 32A and 32B by heating and the evaporation object 1 retained by the can rolls 4A and 4B. Thus, when evaporation treatment is performed for the evaporation object 1 (forming the thin film), the radiation heat of the evaporation sources 3A and 3B to the evaporation object 1 is decreased, and the temperature of the evaporation object 1 itself is inhibited from being increased. As a result, alteration of the evaporation materials 32A and 32B deposited on the evaporation object 1 and generation of unnecessary side reaction products resulting from reaction with the evaporation object 1 are easily avoided. Therefore, by using the evaporation apparatus, while the quality of the thin film formed on the evaporation object 1 is maintained, the vaporization amount from the evaporation sources 3A and 3B per unit time is able to be increased. Accordingly, it is advantageous to improvement of production efficiency.

In particular, the heat shield plates 5A and 5B are provided with the openings 51A and 51B in the position corresponding to the depressed portion 33A containing the evaporation materials 32A and 32B, so that the entire crucibles 31A and 31B are blocked from the evaporation object 1. Thus, while smoothly passing the evaporated evaporation materials 32A and 32B, the radiation heat is effectively blocked. The end faces 52A and 52B of the openings 51A and 51B are the tilted surface. Thus, the radiation heat to the evaporation object 1 is able to be more decreased without decreasing the amount of the evaporation material 32A that passes through the openings 51A and 51B and reaches the can roll 4A (evaporation object 1).

Further, the heat shield plates 5A and 5B are arranged with a given distance from the crucibles 31A and 31B. Thus, while sufficiently decreasing the radiation heat to the evaporation object 1, the temperature of the crucibles 31A and 31B are increased and thereby the vaporization amount of the evaporation materials 32A and 32B is able to be further increased. Furthermore, since the heat shield plates 5A and 5B include the mechanism to cool themselves, the radiation heat generated from the heat shield plates 5A and 5B as a heat source is inhibited, and adverse effect on the evaporation object 1 and the thin film formed on the surface thereof is able to be avoided.

The evaporation apparatus having the foregoing configuration is suitable for manufacturing an anode having a structure, for example, in which an active material layer is provided on the surface of a current collector.

Figure 3:
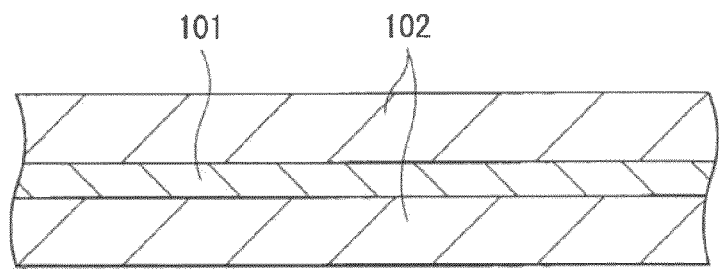
FIG. 3 is a cross section view showing a structure of an anode according to the embodiment of the invention.

First, a description will be given of a structure of an anode manufactured by using the evaporation apparatus according to the embodiment of the invention. FIG. 3 shows a cross sectional structure of the anode. The anode is used, for example, for an electrochemical device such as a battery. The anode has an anode current collector 101 having a pair of opposed faces and an anode active material layer 102 provided on the anode current collector 101.

The anode current collector 101 is preferably made of a material having favorable electrochemical stability, favorable electric conductivity, and favorable mechanical strength. As the material, for example, a metal material such as copper (Cu), nickel (Ni), and stainless steel is cited. Specially, copper is preferable since a high electric conductivity is thereby obtained.

The anode active material layer 102 contains one or more anode materials capable of inserting and extracting an electrode reactant as an anode active material, and may also contain an electrical conductor, a binder or the like according to needs. The anode active material layer 102 may be provided on the both faces of the anode current collector 101, or may be provided on a single face of the anode current collector 101.

As the anode material capable of inserting and extracting the electrode reactant, for example, a material that can insert and extract the electrode reactant and contains at least one of metal elements and metalloid elements as an element is cited. Such an anode material is preferably used, since a high energy density is thereby obtained. Such an anode material may be a simple substance, an alloy, or a compound of a metal element or a metalloid element, or a material having one or more phases thereof at least in part. In the invention, "the alloy" includes an alloy containing one or more metal elements and one or more metalloid elements, in addition to an alloy composed of two or more metal elements. Further, "the alloy" in the invention may contain a nonmetallic element. The texture thereof includes a solid solution, a eutectic crystal (eutectic mixture), an intermetallic compound, and a texture in which two or more thereof coexist.

As such a metal element or such a metalloid element composing the anode material, for example, a metal element or a metalloid element capable of forming an alloy with the electrode reactant is cited. Specifically, magnesium (Mg), boron (B), aluminum (Al), gallium (Ga), indium (In), silicon (Si), germanium (Ge), tin (Sn), lead (Pb), bismuth (Bi), cadmium (Cd), silver (Ag), zinc (Zn), hafnium (Hf), zirconium (Zr), yttrium (Y), palladium (Pd), platinum (Pt) and the like are cited. Specially, at least one of silicon and tin is preferable. Silicon and tin have the high ability to insert and extract the electrode reactant, and thus provide a high energy density.

As an anode material containing at least one of silicon and tin, for example, the simple substance, an alloy, or a compound of silicon; the simple substance, an alloy, or a compound of tin; or a material having at least in part one or more phases thereof are cited. Each thereof may be used singly, or a plurality thereof may be used by mixture.

As the anode material containing the simple substance of silicon, for example, a material containing the simple substance of silicon as a main body is cited. The anode active material layer 102 containing such an anode material has, for example, a structure in which oxygen (O) and the second element other than silicon exist between silicon simple substance layers. The total content of silicon and oxygen in the anode active material layer 102 is preferably 50 wt % or more, and in particular, the content of the silicon simple substance is preferably 50 wt % or more. As the second element other than silicon, for example, titanium (Ti), chromium (Cr), manganese (Mn), iron, cobalt (Co), nickel, copper, zinc, indium, silver, magnesium (Mg), aluminum, germanium, tin, bismuth, antimony (Sb) and the like are cited. The anode active material layer 102 that contains the material containing the simple substance of silicon as a main body may be formed by co-evaporating silicon and other element.

As the alloy of silicon, for example, a material containing at least one selected from the group consisting of tin, nickel, copper, iron, cobalt, manganese, zinc, indium, silver, titanium, germanium, bismuth, antimony, and chromium as the second element other than silicon is cited. As the compound of silicon, for example, a material containing oxygen or carbon (C) is cited, and may contain the foregoing second element in addition to silicon. Examples of the alloy or the compound of silicon include, for example, $SiB_4$, $SiB_6$, $Mg_2Si$, $Ni_2Si$, $TiSi_2$, $MoSi_2$, $CoSi_2$, $NiSi_2$, $CaSi_2$, $CrSi_2$, $Cu_5Si$, $FeSi_2$, $MnSi_2$, $NbSi_2$, $TaSi_2$, $VSi_2$, $WSi_2$, $ZnSi_2$, $SiC$, $Si_3N_4$, $Si_2N_2O$, $SiO_v$ ($0<v\leq2$), $SnO_w$ ($0<w\leq2$), LiSiO and the like.

As the alloy of tin, for example, a material containing at least one selected from the group consisting of silicon, nickel, copper, iron, cobalt, manganese, zinc, indium, silver, titanium, germanium, bismuth, antimony, and chromium as the second element other than tin is cited. As the compound of tin, for example, a compound containing oxygen or carbon is cited. The compound may contain the foregoing second element in addition to tin. Examples of the alloy or the compound of tin include $SnSiO_3$, LiSnO, $Mg_2Sn$ and the like.

In particular, as the anode material containing at least one of silicon and tin, for example, a material containing the second element and the third element in addition to tin as the first element is preferable. The second element is at least one selected from the group consisting of cobalt, iron, magnesium, titanium, vanadium (V), chromium, manganese, nickel, copper, zinc, gallium, zirconium, niobium (Nb), molybdenum (Mo), silver, indium, cerium (Ce), hafnium, tantalum (Ta), tungsten (W), bismuth, and silicon. The third element is at least one selected from the group consisting of boron, carbon, aluminum, and phosphorus (P). When the second element and the third element are contained, the cycle characteristics are improved.

Specially, a SnCoC-containing material that contains tin, cobalt, and carbon as an element in which the carbon content is in the range from 9.9 wt % to 29.7 wt % and the cobalt ratio to the total of tin and cobalt (Co/(Sn+Co)) is in the range from 30 wt % to 70 wt % is preferable. In such a composition range, a high energy density is obtained.

The SnCoC-containing material may further contain other element according to needs. As other element, for example, silicon, iron, nickel, chromium, indium, niobium, germanium, titanium, molybdenum, aluminum, phosphorus, gallium, bismuth or the like is preferable. Two or more thereof may be contained, since thereby higher effects are obtained.

The SnCoC-containing material has a phase containing tin, cobalt, and carbon. Such a phase preferably has a low crystallinity structure or an amorphous structure. Further, in the SnCoC-containing material, at least part of carbon as an element is preferably bonded to a metal element or a metalloid element as other element. Cohesion or crystallization of tin or the like is thereby inhibited.

As a measurement method for examining bonding state of elements, for example, X-ray Photoelectron Spectroscopy (XPS) is cited. In XPS, in the case of graphite, the peak of is orbit of carbon (C1s) is observed at 284.5 eV in the apparatus in which energy calibration is made so that the peak of 4f orbit of gold atom (Au4f) is obtained in 84.0 eV. In the case of surface contamination carbon, the peak is observed at 284.8 eV. Meanwhile, in the case of higher electric charge density of carbon element, for example, when carbon is bonded to a metal element or a metalloid element, the peak of C1s is observed in the region lower than 284.5 eV. That is, when the peak of the composite wave of C1s obtained for the SnCoC-containing material is observed in the region lower than 284.5 eV, at least part of carbon contained in the SnCoC-containing material is bonded to the metal element or the metalloid element as other element.

In XPS, for example, the peak of C is used for correcting the energy axis of spectrums. Since surface contamination carbon generally exists on the surface, the peak of C1s of the surface contamination carbon is set to in 284.8 eV, which is used as an energy reference. In XPS, the waveform of the peak of C1s obtained as a form including the peak of the surface contamination carbon and the peak of carbon in the SnCoC-containing material. Therefore, for example, by performing analysis by using commercially available software, the peak of the surface contamination carbon and the peak of carbon in the SnCoC-containing material are separated. In the analysis of the waveform, the position of the main peak existing on the lowest bound energy side is set to the energy reference (284.8 eV).

The anode active material layer 102 using the simple substance, an alloy, or a compound of silicon; the simple substance, an alloy, or a compound of tin; or the material having at least in part one or more phases thereof is formed by using, for example, vacuum evaporation method. The anode active material layer 102 and the anode current collector 101 are preferably alloyed in at least part of the interface thereof. Specifically, it is preferable that at the interface thereof, the element of the anode current collector 101 is diffused in the anode active material layer 102; or the element of the anode active material layer 102 is diffused in the anode current collector 101; or these elements are diffused in each other. Thereby, destruction due to expansion and shrinkage of the anode active material layer 102 associated with charge and discharge is inhibited, and the electron conductivity between the anode active material layer 102 and the anode current collector 101 is improved. As the vacuum evaporation method, electron beam evaporation method, resistance heating method and the like are cited.

Subsequently, a description will be given of a method of manufacturing the anode. The anode is manufactured as follows. The anode current collector 101 is prepared, and surface roughening is provided for the surface thereof according to needs. After that, the anode active material layer 102 composed of a plurality of anode active material particles having silicon is formed on the anode current collector 101 by vacuum evaporation method using the foregoing evaporation apparatus.

Specifically, first, as shown in FIG. 1, the anode current collector 101 as a roll is attached to the wind-up roller 7, and the end on the outer circumferential side is pulled out. The end is attached to a fit portion (not shown) of the wind-up roller 8 through the guide roller 9, the can roll 4A, the guide roller 10, the feed roller 14, the guide roller 11, the guide roller 12, the can roll 4B, and the guide roller 13 sequentially.

Next, air is exhausted by the vacuum air exhaust 15, so that the vacuum degree inside the evaporation treatment bath 2 is a given value (for example, about $10^{-3}$ Pa). At this point, the shutters 6A and 6B are closed. While the shutters 6A and 6B are kept closed, the evaporation materials 32A and 32B contained in the crucibles 31A and 31B are heated, and evaporated (vaporized). In this state, observation of the vaporization rate of the evaporation materials 32A and 32B contained in crucibles 31A and 31B is started by using a quartz monitor (not shown) or the like. At the instant when a given time lapses from vaporization start, determination is made whether or not the vaporization rate reaches the target value and whether or not the vaporization rate becomes stable. When it is confirmed that the vaporization rate reaches the target value and becomes stable, the wind-up roller 8 and the like are driven to start running of the anode current collector 101 and to open the shutters 6A and 6B. Thereby, the volatilized evaporation materials 32A and 32B pass through the openings 51A and 51B and the opened shutters 6A and 6B sequentially and reach the anode current collector 101 retained by the can rolls 4A and 4B. Then, evaporation to the both faces of the anode current collector 101 starts. As a result, by adjusting the running rate of the anode current collector 101 and the evaporation rate of the evaporation materials 32A and 32B, the anode active material layer 102 having a given thickness is formed.

The description has been given of the case where the anode active material layer 102 is formed on the anode current collector 101 while the anode current collector 101 runs through the wind-up roller 7 to the wind-up roller 8 (for convenience, referred to as forward running). However, it is possible that the anode active material layer 102 is formed while the anode current collector 101 runs in the reverse direction, that is, runs through the wind-up roller 8 to the wind-up roller 7. In this case, the wind-up rollers 7 and 8, the guide rollers 9 to 13, the feed roller 14, and the can rolls 4A and 4B are rotated in the reverse direction. The anode active material layer 102 may be formed at a time by single running of the anode current collector 101, or may be formed by a plurality of runs. For example, it is possible that after evaporation is made for part of the target thickness while the anode current collector 101 runs in the forward direction, evaporation is subsequently made for the rest of the target thickness while the anode current collector 101 runs in the reverse direction.

As described above, according to the method of manufacturing an anode of this embodiment, by using the heat shield plates 5A and 5B, the radiation heat of the evaporation sources 3A and 3B to the anode current collector 101 is decreased, and excessive temperature increase of the anode current collector 101 itself is avoided. Thus, unnecessary products (intermetallic compound and the like) generated resulting from side reaction between the component material of the anode current collector 101 and the anode active material (evaporation materials 32A and 32B) are inhibited, and the anode including the anode active material layer 102 having a more homogenized and good quality crystal structure is able to be manufactured. Therefore, when the anode is used together with an electrolytic solution for an electrochemical device such as a battery, improvement of the cycle characteristics is expected. Further, temperature increase of the anode current collector 101 in forming the anode active material layer 102 is inhibited, and possibility of breaking due to extension is decreased. Thus, the thickness of the anode current collector 101 is further reduced. Furthermore, the vaporization amount from the evaporation sources 3A and 3B is increased while temperature increase of the anode current collector 101 is inhibited, and production efficiency is improved.

Next, a description will be hereinafter given of a usage example of the foregoing anode. As an example of the electrochemical devices, batteries are herein taken. The anode is used for the batteries as follows.

First Battery

Figure 4:
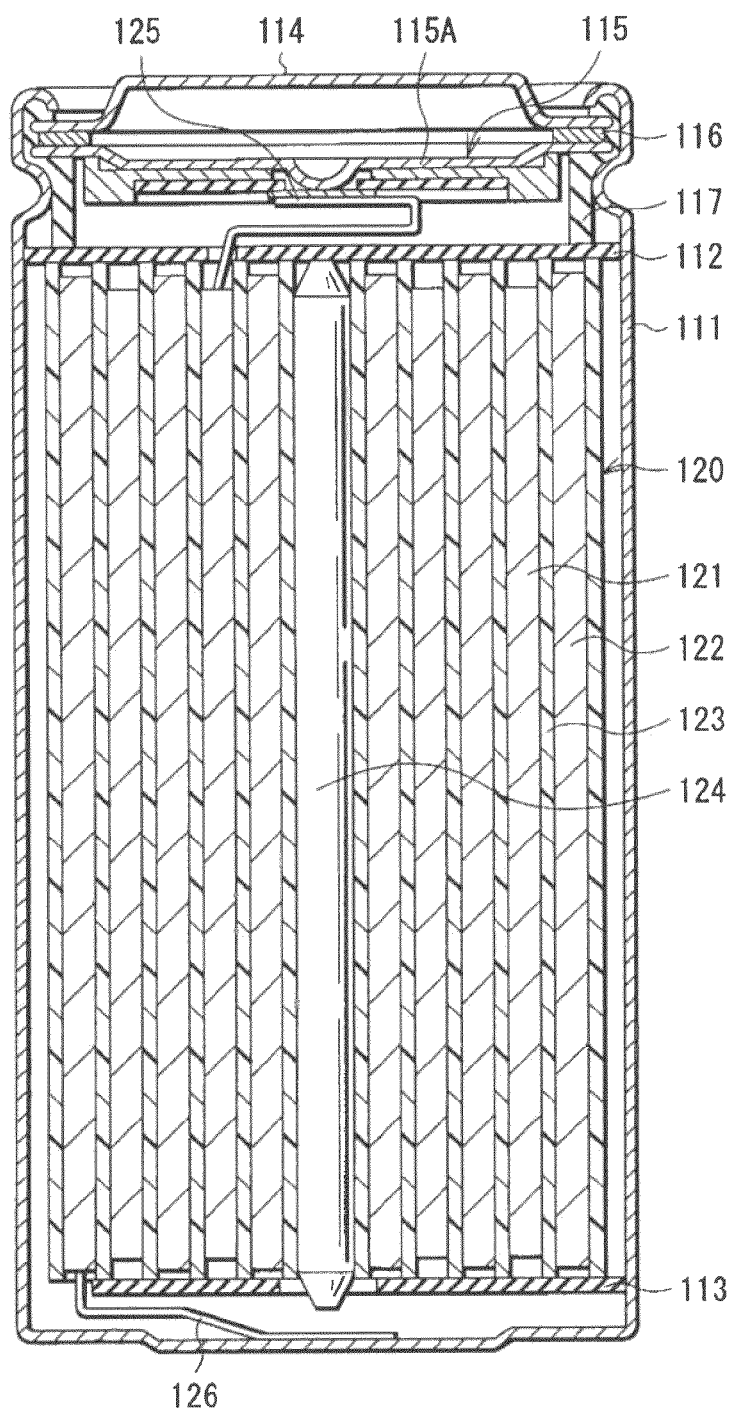
FIG. 4 is a cross section view showing a structure of a first battery using the anode according to the embodiment of the invention.

FIG. 4 shows a cross sectional structure of a first battery. The battery is, for example, a so-called lithium ion secondary battery in which the anode capacity is expressed by the capacity component based on insertion and extraction of lithium as an electrode reactant.

In the secondary battery, a spirally wound electrode body 120 in which a cathode 121 and an anode 122 are layered with a separator 123 in between and spirally wound and a pair of insulating plates 112 and 113 are contained in a battery can 111 in the shape of an approximately hollow cylinder. The battery can 111 is made of, for example, iron plated by nickel. One end of the battery can 111 is closed, and the other end thereof is opened. The pair of insulating plates 112 and 113 is respectively arranged perpendicular to the spirally wound periphery face, so that the spirally wound electrode body 120 is sandwiched between the insulating plates 112 and 113. The battery structure using the battery can 111 is so-called cylindrical type.

At the open end of the battery can 111, a battery cover 114, and a safety valve mechanism 115 and a Positive Temperature Coefficient (PTC) device 116 provided inside the battery cover 114 are attached by being caulked with a gasket 117. Inside of the battery can 111 is thereby hermetically closed. The battery cover 114 is, for example, made of a material similar to that of the battery can 111. The safety valve mechanism 115 is electrically connected to the battery cover 114 through the PTC device 116. If the internal pressure of the battery becomes a certain level or more due to internal short circuit, external heating or the like, a disk plate 115A flips to cut the electrical connection between the battery cover 114 and the spirally wound electrode body 120. When temperature rises, the PTC device 116 limits a current by increasing the resistance to prevent abnormal heat generation resulting from a large current. The gasket 117 is made of, for example, an insulating material and its surface is coated with asphalt.

A center pin 124 is inserted in the center of the spirally wound electrode body 120. In the spirally wound electrode body 120, a cathode lead 125 made of aluminum or the like is connected to the cathode 121, and an anode lead 126 made of nickel or the like is connected to the anode 122. The cathode lead 125 is electrically connected to the battery cover 114 by being welded to the safety valve mechanism 115. The anode lead 126 is welded and electrically connected to the battery can 111.

Figure 5:
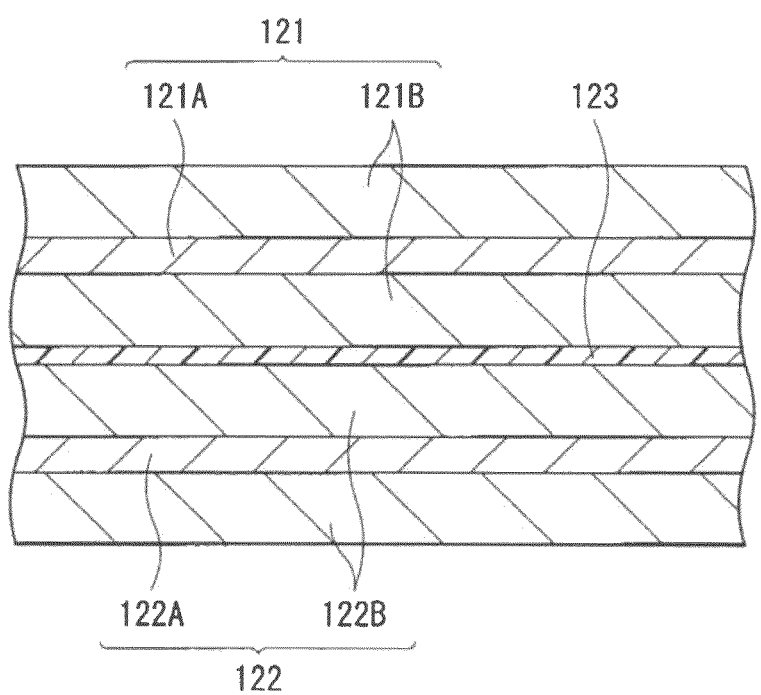
FIG. 5 is a cross section view showing an enlarged part of the spirally wound electrode body shown in FIG. 4.

FIG. 5 shows an enlarged part of the spirally wound electrode body 120 shown in FIG. 4. The cathode 121 has a structure in which, for example, a cathode active material layer 121B is provided on the both faces of a cathode current collector 121A having a pair of opposed faces. The cathode current collector 121A is made of, for example, a metal material such as aluminum, nickel, and stainless. The cathode active material layer 121B contains as a cathode active material, for example, one or more cathode materials capable of inserting and extracting lithium as an electrode reactant. The cathode active material layer 121B may contain an electrical conductor, a binder and the like according to needs. When the cathode active material layer 121B contains the binder, and the cathode 121 and the anode 122 are spirally wound as shown in FIG. 5, styrene-butadiene rubber, fluorinated rubber or the like having flexibility is preferably used as the binder thereof.

As the cathode material capable of inserting and extracting lithium, for example, a lithium-containing compound is preferable, since thereby a high energy density is obtained. As the lithium-containing compound, for example, a complex oxide containing lithium and a transition metal element or a phosphate compound containing lithium and a transition metal element is cited. In particular, a compound containing at least one of cobalt, nickel, manganese, and iron as a transition metal element is preferable, since thereby a higher voltage is obtained. The chemical formula thereof is expressed by, for example, $Li_xM1O_2$ or $Li_yM2PO_4$. In the formula, M1 and M2 represent one or more transition metal elements. Values of x and y vary according to charge and discharge states of the battery, and are generally in the range of $0.05 \leq x \leq 1.10$ and $0.05 \leq y \leq 1.10$.

As the lithium complex oxide containing lithium and a transition metal element, for example, a lithium-cobalt complex oxide ($Li_xCoO_2$), a lithium-nickel complex oxide ($Li_xNiO_2$), a lithium-nickel-cobalt complex oxide ($Li_xNi_{(1-z)}Co_zO_2$ (z<1)), a lithium-nickel-cobalt-manganese complex oxide ($Li_xNi_{1(1-v-w)}Co_vMn_wO_2$ (v+w<1)), lithium-manganese complex oxide having a spinel type structure ($LiMn_2O_4$) and the like are cited. Specially, the complex oxide containing nickel is preferable, since thereby a high capacity and superior cycle characteristics are obtained. As the phosphate compound containing lithium and a transition metal element, for example, lithium-iron phosphate compound ($LiFePO_4$), a lithium-iron-manganese phosphate compound ($LiFe_{(1-u)}Mn_uPO_4$ (u<1)) and the like are cited.

In addition to the foregoing compounds, for example, an oxide such as titanium oxide, vanadium oxide, and manganese dioxide; a disulfide such as iron disulfide, titanium disulfide, and molybdenum disulfide; a chalcogenide such as niobium selenide; sulfur; and a conductive polymer such as polyaniline and polythiophene are cited.

The anode 122 has, for example, a structure similar to that of the anode shown in FIG. 3. The anode 122 has a structure in which an anode active material layer 122B is provided on the both faces of a strip-shaped anode current collector 122A. Structures of the anode current collector 122A and the anode active material layer 122B are respectively similar to the structures of the anode current collector 101 and the anode active material layer 102.

In the secondary battery, the charge capacity of the foregoing anode active material is larger than the charge capacity of the cathode active material by adjusting the amount of the cathode active material and the amount of the anode active material capable of inserting and extracting lithium. Thus, a lithium metal is not precipitated on the anode 122 when fully charged.

The separator 123 separates the cathode 121 from the anode 122, prevents current short circuit due to contact of both electrodes, and passes lithium ions. The separator 123 is made of, for example, a porous film made of a synthetic resin such as polytetrafluoroethylene, polypropylene, and polyethylene, or a ceramic porous film. The separator 123 may have a structure in which two or more of the foregoing porous films are layered. Specially, the porous film made of polyolefin is preferable, since such a film has a superior short circuit preventive effect and improves safety of the battery by shutdown effect. In particular, polyethylene is preferable, since polyethylene provides shutdown effect at from 100 deg C. to 160 deg C. and has superior electrochemical stability. Further, polypropylene is also preferable. In addition, as long as chemical stability is secured, a resin formed by copolymerizing or blending with polyethylene or polypropylene may be used.

An electrolytic solution as a liquid electrolyte is impregnated in the separator 123. The electrolytic solution contains a solvent and an electrolyte salt dissolved in the solvent.

The solvent contains, for example, a nonaqueous solvent such as an organic solvent. The nonaqueous solvents include, for example, ethylene carbonate, propylene carbonate, butylene carbonate, dimethyl carbonate, diethyl carbonate, ethyl methyl carbonate, methyl propyl carbonate, γ-butyrolactone, γ-valerolactone, 1,2-dimethoxyethane, tetrahydrofuran, 2-methyltetrahydrofuran, tetrahydropyran, 1,3-dioxolane, 4-methyl-1,3-dioxolane, 1,3-dioxane, 1,4-dioxane, methyl acetate, ethyl acetate, methyl propionate, ethyl propionate, methyl butyrate, methyl isobutyrate, trimethyl methyl acetate, trimethyl ethyl acetate, acetonitrile, glutaronitrile, adiponitrile, methoxyacetonitrile, 3-methoxypropionitrile, N,N-dimethylformamide, N-methylpyrrolidinone, N-methyloxazolidinone, N,N'-dimethylimidazolidinone, nitromethane, nitroethane, sulfolane, trimethyl phosphate, dimethyl sulfoxide, dimethyl sulfoxide phosphate and the like. The solvent may be used singly, or a plurality thereof may be used by mixture. Specially, the solvent preferably contains at least one selected from the group consisting of ethylene carbonate, propylene carbonate, dimethyl carbonate, diethyl carbonate, and ethyl methyl carbonate. Thereby, sufficient cycle characteristics are obtained. In this case, in particular, a mixture of a high-viscosity (high dielectric constant) solvent (for example, specific inductive $\in \geq 30$) such as ethylene carbonate and propylene carbonate and a low-viscosity solvent (for example, viscosity $\leq 1$ mPa·s) such as dimethyl carbonate, ethyl methyl carbonate, and diethyl carbonate is preferably contained. Thereby, the dissociation property of the electrolyte salt and the ion mobility are improved, and thus higher effects are obtained.

The solvent preferably contains a cyclic ester carbonate having an unsaturated bond, since thereby the cycle characteristics are improved. The content of the cyclic ester carbonate having an unsaturated bond in the solvent is preferably in the range from 1 wt % to 10 wt %, since thereby sufficient effects are obtained. As the cyclic ester carbonate having an unsaturated bond, for example, vinylene carbonate, vinylethylene carbonate and the like are cited. One thereof may be used singly, or a plurality thereof may be used by mixture.

The electrolyte salt contains, for example, one or more light metal salts such as a lithium salt. As the lithium salt, for example, at least one selected from the group consisting of lithium hexafluorophosphate, lithium tetrafluoroborate, lithium perchlorate, and lithium hexafluoroarsenate is cited, since thereby sufficient cycle characteristics are obtained. One thereof may be used singly, or a plurality thereof may be used by mixture. Specially, lithium hexafluorophosphate is preferable, since the internal resistance is lowered, and thus higher effects are obtained.

The content of the electrolyte salt to the solvent is preferably in the range from 0.3 mol/kg to 3.0 mol/kg. If the content is out of the foregoing range, there is a possibility that the ion conductivity is significantly lowered and thus the capacity characteristics and the like are not able to be sufficiently obtained.

The secondary battery may be manufactured, for example, as follows.

First, the cathode 121 is formed by forming the cathode active material layer 121B on the both faces of the cathode current collector 121A. In this case, cathode active material powder, an electrical conductor, and a binder are mixed to prepare a cathode mixture, which is dispersed in a solvent to obtain paste cathode mixture slurry. Then, the cathode current collector 121A is coated with the cathode mixture slurry, which is dried, and the resultant is compression-molded. Further, by a procedure similar to that of the foregoing method of manufacturing the anode, the anode 122 is formed by forming the anode active material layer 122B on the both faces of the anode current collector 122A.

Subsequently, the cathode lead 125 is attached to the cathode current collector 121A by being welded, and the anode lead 126 is attached to the anode current collector 122A by being welded. Subsequently, the cathode 121 and the anode 122 are spirally wound with the separator 123 in between, and thereby the spirally wound electrode body 120 is formed. The end of the cathode lead 125 is welded to the safety valve mechanism 115, and the end of the anode lead 126 is welded to the battery can 111. After that, the spirally wound electrode body 120 is sandwiched between the pair of insulating plates 112 and 113, and contained inside the battery can 111. Subsequently, an electrolytic solution is injected into the battery can 111 and impregnated in the separator 123. Finally, at the open end of the battery can 111, the battery cover 114, the safety valve mechanism 115, and the PTC device 116 are fixed by being caulked with the gasket 117. The secondary battery shown in FIG. 4 and FIG. 5 is thereby fabricated.

In the secondary battery, when charged, for example, lithium ions are extracted from the cathode 121 to the electrolytic solution, and the extracted lithium ions are inserted in the anode active material layer 122B through the electrolytic solution. Meanwhile, when discharged, lithium ions are extracted from the anode active material layer 122B, and inserted in the cathode 121 through the electrolytic solution.

According to the secondary battery and the method of manufacturing the same, the anode 122 has the structure similar to that of the anode shown in FIG. 3 described above, and is formed by the method similar to that of the method of manufacturing the anode described above. Therefore, the cycle characteristics are improved.

Second Battery

Figure 6:
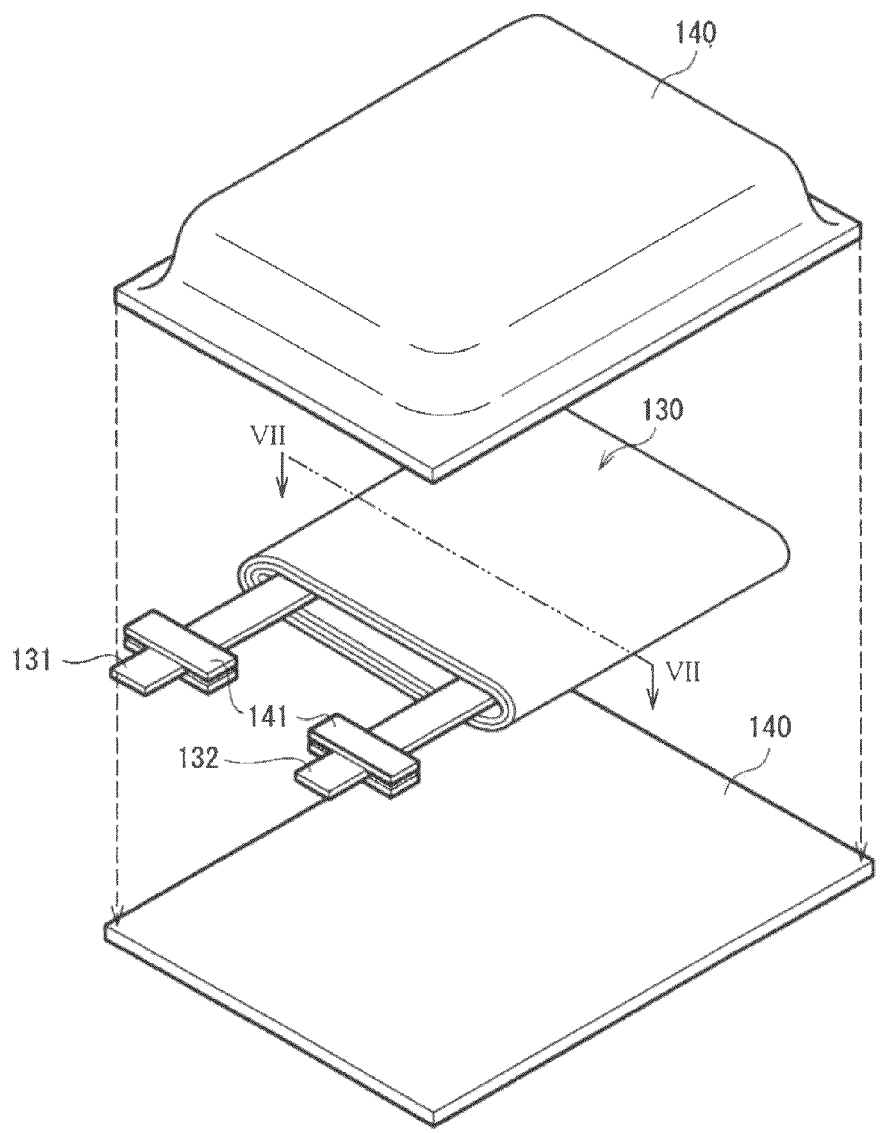
FIG. 6 is an exploded perspective view showing a structure of a second battery using the anode according to the embodiment of the invention.

FIG. 6 shows an exploded perspective structure of a second battery. The battery is a so-called lithium ion secondary battery in which a spirally wound electrode body 130 to which a cathode lead 131 and an anode lead 132 are attached is contained in a film package member 140. The battery structure using the film package member 140 is so-called laminated film type.

The cathode lead 131 and the anode lead 132 are respectively derived in the same direction from inside to outside of the package member 140. The cathode lead 131 is made of, for example, a metal material such as aluminum. The anode lead 132 is made of, for example, a metal material such as copper, nickel, and stainless. Each metal material composing the cathode lead 131 and the anode lead 132 is in the shape of, for example, a thin plate or mesh.

The package member 140 is made of a rectangular aluminum laminated film in which, for example, a nylon film, an aluminum foil, and a polyethylene film are bonded together in this order. In the package member 140, for example, the polyethylene film and the spirally wound electrode body 130 are opposed to each other, and the respective outer edges are contacted to each other by fusion bonding or an adhesive. Adhesive films 141 to protect from entering of outside air are inserted between the package member 140 and the cathode lead 131, the anode lead 132. The adhesive film 141 is made of a material having contact characteristics to the cathode lead 131 and the anode lead 132, for example, is made of a polyolefin resin such as polyethylene, polypropylene, modified polyethylene, and modified polypropylene.

The package member 140 may be made of a laminated film having other structure, a polymer film made of polypropylene or the like, or a metal film, instead of the foregoing 3-layer aluminum laminated film.

Figure 7:
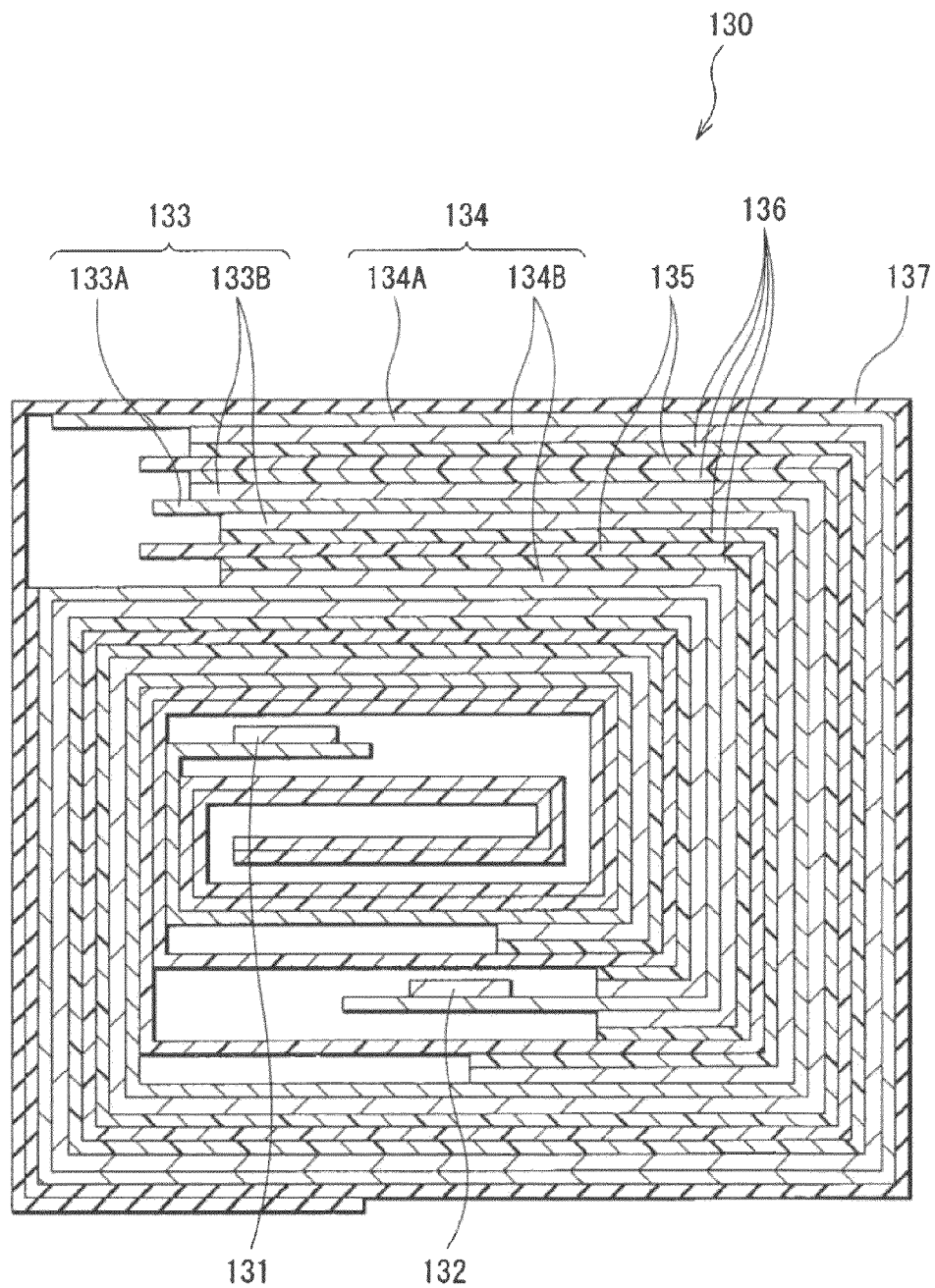
FIG. 7 is a cross section view showing a structure taken along section line VII-VII of the spirally wound electrode body shown in FIG. 6.

FIG. 7 shows a cross sectional structure taken along line VII-VII of the spirally wound electrode body 130 shown in FIG. 6. In the spirally wound electrode body 130, a cathode 133 and an anode 134 are layered with a separator 135 and an electrolyte 136 in between and then spirally wound. The outermost periphery thereof is protected by a protective tape 137.

Figure 8:
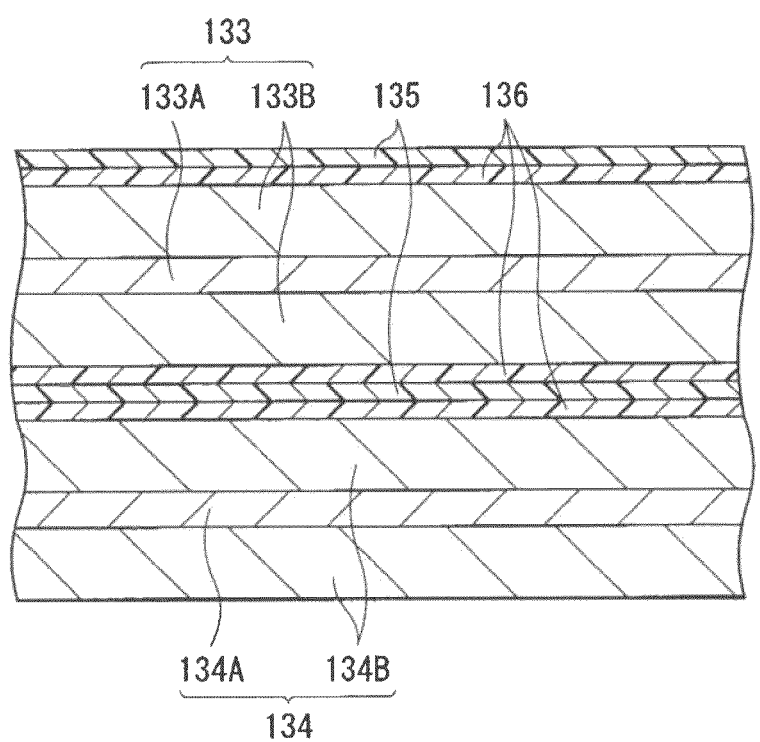
FIG. 8 is a cross section view showing an enlarged part of the spirally wound electrode body shown in FIG. 7.

FIG. 8 shows an enlarged part of the spirally wound electrode body 130 shown in FIG. 7. The cathode 133 has, for example, a structure in which a cathode active material layer 133B is provided on the both faces of a cathode current collector 133A. The anode 134 has, for example, a structure similar to that of the anode shown in FIG. 3. The anode 134 has a structure in which an anode active material layer 134B is provided on the both faces of an anode current collector 134A. Structures of the cathode current collector 133A, the cathode active material layer 133B, the anode current collector 134A, the anode active material layer 134B, and the separator 135 are respectively similar to those of the cathode current collector 121A, the cathode active material layer 121B, the anode current collector 122A, the anode active material layer 122B, and the separator 123 in the first battery described above.

The electrolyte 136 is so-called gelatinous, containing an electrolytic solution and a polymer compound that holds the electrolytic solution. The gel electrolyte is preferable, since a high ion conductivity (for example, 1 mS/cm or more at room temperature) is thereby obtained, and leakage of the battery is thereby prevented.

As the polymer compound, for example, an ether polymer compound such as polyethylene oxide and a cross-linked body containing polyethylene oxide, an ester polymer compound such as polymethacrylate or an acrylate polymer compound, or a polymer of vinylidene fluoride such as polyvinylidene fluoride and a copolymer of vinylidene fluoride and hexafluoropropylene are cited. One thereof may be used singly, or a plurality thereof may be used by mixture. In particular, in terms of redox stability, the fluorinated polymer compound such as the polymer of vinylidene fluoride or the like is preferable. The additive amount of the polymer compound in the electrolytic solution varies according to compatibility between the electrolytic solution and the polymer compound, but, for example, is preferably in the range from 5 wt % to 50 wt %.

The composition of the electrolytic solution is similar to the composition of the electrolytic solution in the foregoing first battery. However, the solvent in this case means a wide concept including not only the liquid solvent but also a solvent having ion conductivity capable of dissociating the electrolyte salt. Therefore, when the polymer compound having ion conductivity is used, the polymer compound is also included in the solvent.

Instead of the electrolyte 136 in which the electrolytic solution is held by the polymer compound, the electrolytic solution may be directly used. In this case, the electrolytic solution is impregnated in the separator 135.

The secondary battery may be manufactured, for example, by the following three manufacturing methods.

In the first manufacturing method, first, the cathode 133 is formed by forming the cathode active material layer 133B on the both faces of the cathode current collector 133A by a procedure similar to that of the method of manufacturing the first battery. Further, for example, the anode 134 is formed by forming the anode active material layer 134B on the both faces of the anode current collector 134A by a procedure similar to that of the method of manufacturing the anode described above.

Subsequently, a precursor solution containing an electrolytic solution, a polymer compound, and a solvent is prepared. After the cathode 133 and the anode 134 are coated with the precursor solution, the solvent is volatilized to form the gel electrolyte 136. Subsequently, the cathode lead 131 and the anode lead 132 are respectively attached to the cathode current collector 133A and the anode current collector 134A. Subsequently, the cathode 133 and the anode 134 provided with the electrolyte 136 are layered with the separator 135 in between to obtain a laminated body. After that, the laminated body is spirally wound in the longitudinal direction, the protective tape 137 is adhered to the outermost periphery thereof to form the spirally wound electrode body 130. Subsequently, for example, after the spirally wound electrode body 130 is sandwiched between two pieces of the film package members 140, outer edges of the package members 140 are contacted by thermal fusion bonding or the like to enclose the spirally wound electrode body 130. The adhesive films 141 are inserted between the cathode lead 131, the anode lead 132 and the package member 140. Thereby, the secondary battery shown in FIG. 6 to FIG. 8 is fabricated.

In the second manufacturing method, first, the cathode lead 131 and the anode lead 132 are respectively attached to the cathode 133 and the anode 134. After that, the cathode 133 and the anode 134 are layered with the separator 135 in between and spirally wound. The protective tape 137 is adhered to the outermost periphery thereof, and thereby a spirally wound body as a precursor of the spirally wound electrode body 130 is formed. Subsequently, after the spirally wound body is sandwiched between two pieces of the film package members 140, the outermost peripheries except for one side are bonded by thermal fusion bonding or the like to obtain a pouched state, and the spirally wound body is contained in the pouch-like package member 140. Subsequently, a composition of matter for electrolyte containing an electrolytic solution, a monomer as a raw material for the polymer compound, a polymerization initiator, and if necessary other material such as a polymerization inhibitor is prepared, which is injected into the pouch-like package member 140. After that, the opening of the package member 140 is hermetically sealed by thermal fusion bonding or the like. Finally, the monomer is thermally polymerized to obtain a polymer compound. Thereby, the gel electrolyte 136 is formed. Accordingly, the secondary battery is fabricated.

In the third manufacturing method, the spirally wound body is formed and contained in the pouch-like package member 140 in the same manner as that of the foregoing first manufacturing method, except that the separator 135 with the both faces coated with a polymer compound is used. As the polymer compound with which the separator 135 is coated, for example, a polymer containing vinylidene fluoride as a component, that is, a homopolymer, a copolymer, a multi-component copolymer and the like are cited. Specifically, polyvinylidene fluoride, a binary copolymer containing vinylidene fluoride and hexafluoropropylene as a component, a ternary copolymer containing vinylidene fluoride, hexafluoropropylene, and chlorotrifluoroethylene as a component and the like are cited. As a polymer compound, in addition to the foregoing polymer containing vinylidene fluoride as a component, another one or more polymer compounds may be used. Subsequently, an electrolytic solution is prepared and injected into the package member 140. After that, the opening of the package member 140 is sealed by thermal fusion bonding or the like. Finally, the resultant is heated while a weight is applied to the package member 140, and the separator 135 is contacted to the cathode 133 and the anode 134 with the polymer compound in between. Thereby, the electrolytic solution is impregnated into the polymer compound, and the polymer compound is gelated to form the electrolyte 136. Accordingly, the secondary battery is fabricated. In the third manufacturing method, the swollenness characteristics are improved more than in the first manufacturing method. Further, in the third manufacturing method, the monomer, the solvent and the like as a raw material of the polymer compound are hardly left in the electrolyte 136 compared to the second manufacturing method, and the formation step of the polymer compound is favorably controlled. Thus, sufficient contact characteristics are obtained between the cathode 133/the anode 134/the separator 135 and the electrolyte 136.

In the secondary battery, as in the foregoing first battery, lithium ions are inserted and extracted between the cathode 133 and the anode 134. That is, when charged, for example, lithium ions are extracted from the cathode 133 and inserted in the anode 134 through the electrolyte 136. Meanwhile, when discharged, lithium ions are extracted from the anode 134, and inserted in the cathode 133 through the electrolyte 136.

Third Battery

Figure 9:
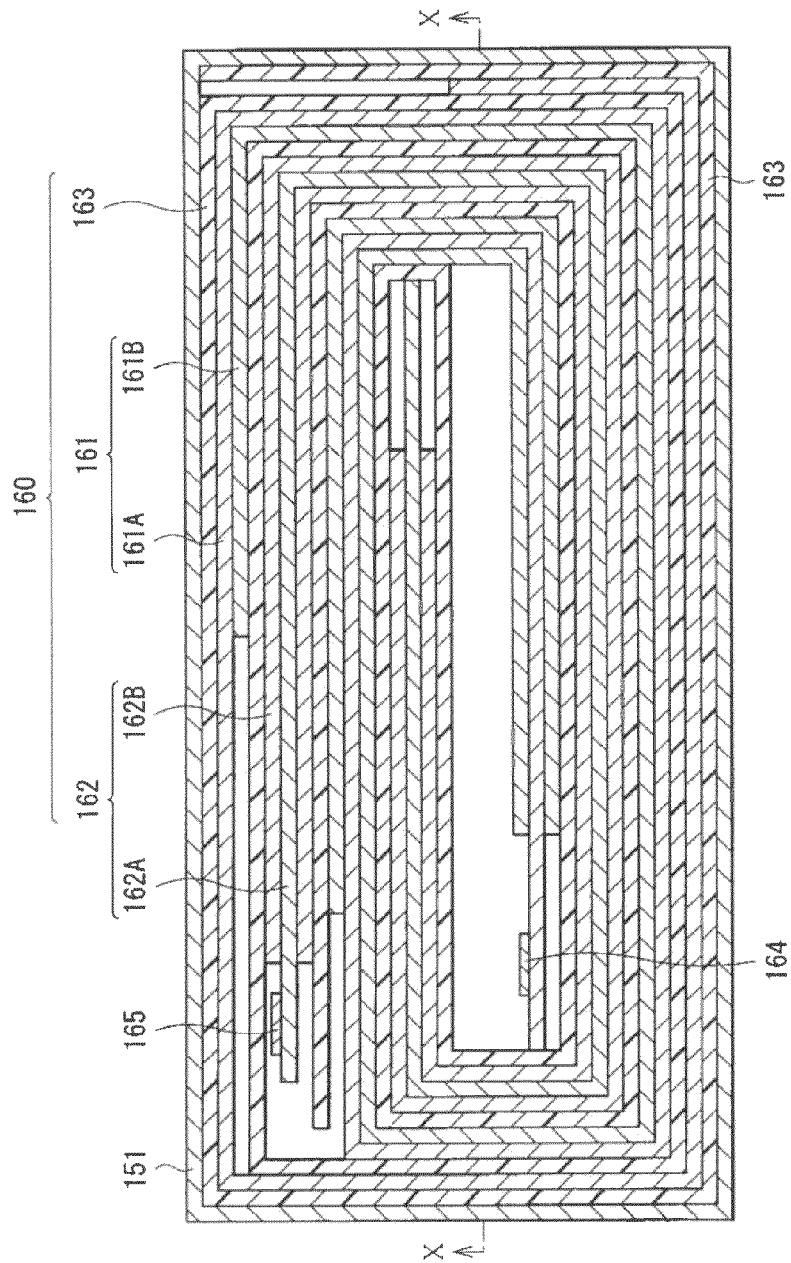
FIG. 9 is a cross section view showing a structure of a third battery using the anode according to the embodiment of the invention.
Figure 10:
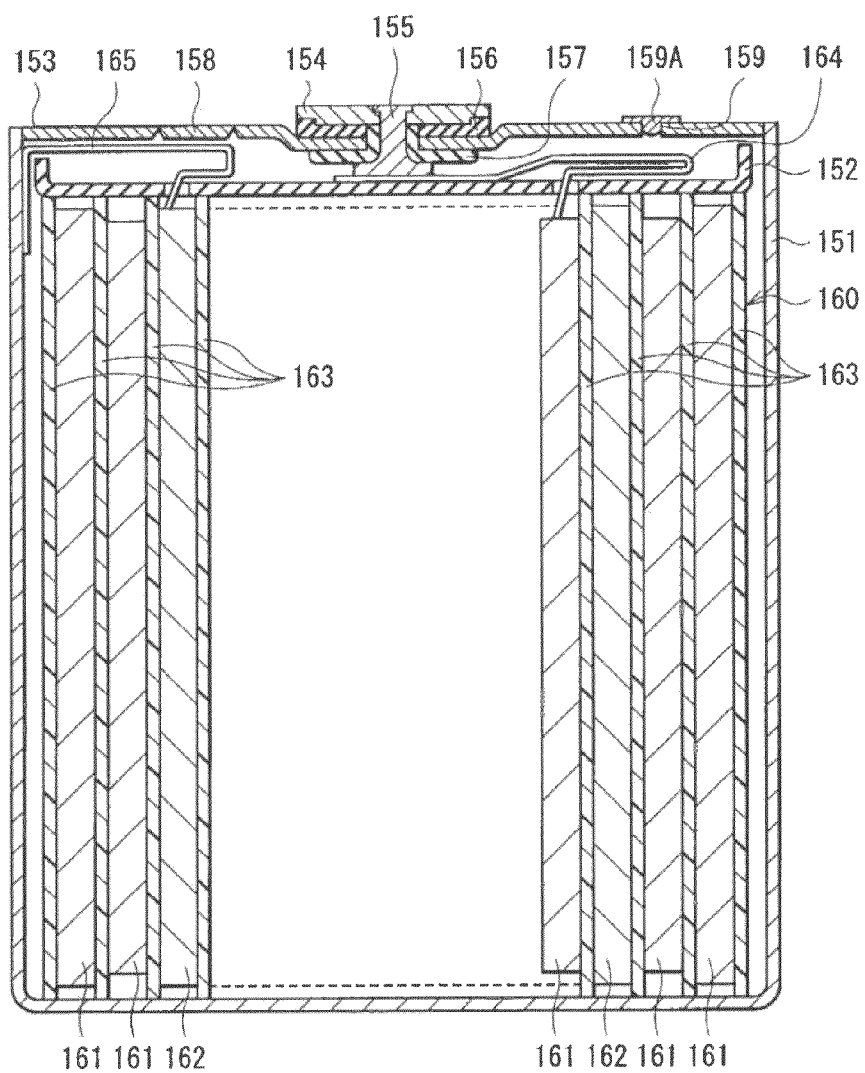
FIG. 10 is a cross section view showing a structure taken along section line X-X of the spirally wound electrode body shown in FIG. 9.

FIG. 9 and FIG. 10 show a cross sectional structure of a third battery. The cross section shown in FIG. 9 and the cross section shown in FIG. 10 are perpendicular to each other as the positional relation. That is, FIG. 10 is the cross section view taken along line X-X shown in FIG. 9. The secondary battery is a so-called square type battery and a lithium ion secondary battery in which a flat spirally wound electrode body 160 is contained in a package can 151 in the shape of an approximate hollow rectangular solid.

The package can 151 is made of, for example iron (Fe) plated by nickel (Ni). The package can 151 also has a function as an anode terminal. One end of the package can 151 is closed and the other end thereof is opened. At the open end of the package can 151, an insulating plate 152 and a battery cover 153 are attached, and thereby inside of the battery can 151 is hermetically closed. The insulating plate 152 is made of, for example, polypropylene or the like, and is arranged perpendicular to the spirally wound circumferential face on the spirally wound electrode body 160. The battery cover 153 is, for example, made of a material similar to that of the battery can 151, and also has a function as an anode terminal together with the package can 151. Outside of the battery cover 153, a terminal plate 154 as a cathode terminal is arranged. In the approximate center of the battery cover 153, a through-hole is provided. A cathode pin 155 electrically connected to the terminal plate 154 is inserted in the through-hole. The terminal plate 154 is electrically insulated from the battery cover 153 with an insulating case 156 in between. The cathode pin 155 is electrically insulated from the battery cover 153 with a gasket 157 in between. The insulating case 156 is made of, for example, polybutylene terephthalate or the like. The gasket 157 is made of, for example, an insulating material, and the surface thereof is coated with asphalt.

In the vicinity of the rim of the battery cover 153, a cleavage valve 158 and an electrolytic solution injection hole 159 are provided. The cleavage valve 158 is electrically connected to the battery cover 153. If the internal pressure of the battery becomes a certain level or more by internal short circuit, external heating or the like, the cleavage valve 158 is cleaved to release the internal pressure. The electrolytic solution injection hole 159 is sealed by a sealing member 159A made of, for example, a steel ball.

In the spirally wound electrode body 160, a cathode 161 and an anode 162 are layered with a separator 163 in between, and are spirally wound. The spirally wound electrode body 160 is shaped flat according to the shape of the package can 151. The separator 163 is located at the outermost circumference of the spirally wound electrode body 160, and the cathode 161 is located just inside thereof. FIG. 10 is a simplified view of the lamination structure of the cathode 161 and the anode 162. The spirally winding number of the spirally wound electrode body 160 is not limited to the number shown in FIG. 9 and FIG. 10, but may be voluntarily set. A cathode lead 164 made of aluminum (Al) or the like is connected to the cathode 161 of the spirally wound electrode body 160. An anode lead 165 made of nickel or the like is connected to the anode 162. The cathode lead 164 is electrically connected to the terminal plate 154 by being welded to the lower end of the cathode pin 155. The anode lead 165 is welded and electrically connected to the package can 151.

As shown in FIG. 9, in the cathode 161, a cathode active material layer 161B is provided on a single face or the both faces of a cathode current collector 161A. In the anode 162, an anode active material layer 162B is provided on a single face or the both faces of an anode current collector 162A. Structures of the cathode current collector 161A, the cathode active material layer 161B, the anode current collector 162A, the anode active material layer 162B, and the separator 163 are respectively similar to the structures of the cathode current collector 121A, the cathode active material layer 121B, the anode current collector 122A, the anode active material layer 122B, and the separator 123 in the first battery described above. An electrolytic solution similar to that of the separator 123 is impregnated in the separator 163.

The secondary battery may be manufactured, for example, as follows.

As in the foregoing first battery, the cathode 161 and the anode 162 are layered with the separator 163 in between and spirally wound, and thereby the spirally wound electrode body 160 is formed. After that, the spirally wound electrode body 160 is contained inside the battery can 151. Next, the insulating plate 152 is arranged on the spirally wound electrode body 160. The anode lead 165 is welded to the battery can 151, the cathode lead 164 is welded to the lower end of the cathode pin 155, and the battery cover 153 is fixed on the open end of the battery can 151 by laser welding or the like. Finally, the electrolytic solution is injected into the package can 151 through the electrolytic solution injection hole 159, and impregnated in the separator 163. After that, the electrolytic solution injection hole 159 is sealed by the sealing member 159A. The secondary battery shown in FIG. 9 and FIG. 10 is thereby fabricated.

According to the secondary battery and the method of manufacturing the same, the anode 162 has the structure similar to that of the anode shown in FIG. 3 described above. In addition, the anode 162 is formed by a method similar to the foregoing method of manufacturing the anode. Accordingly, the cycle characteristics are improved.

EXAMPLE

A specific example of the invention will be described in detail.

Example 1

The square secondary battery shown in FIG. 9 and FIG. 10 was manufactured by the following procedure. The secondary battery was formed as a lithium ion secondary battery in which the capacity of the anode 162 was expressed by a capacity component based on insertion and extraction of lithium.

First, the cathode 161 was formed. That is, lithium carbonate ($Li_2CO_3$) and cobalt carbonate ($CoCO_3$) were mixed at a molar ratio of 0.5:1. After that, the mixture was fired in the air at 900 deg C. for 5 hours. Thereby, lithium cobalt complex oxide ($LiCoO_2$) was obtained. Subsequently, 96 parts by weight of the lithium cobalt complex oxide as a cathode active material, 1 part by weight of graphite as an electrical conductor, and 3 parts by weight of polyvinylidene fluoride as a binder were mixed to obtain a cathode mixture. After that, the cathode mixture was dispersed in N-methyl-2-pyrrolidone to obtain paste cathode mixture slurry. Finally, the both faces of the cathode current collector 161A made of a strip-shaped aluminum foil (thickness: 12 μm) were uniformly coated with the cathode mixture slurry, which was dried. After that, the resultant was compression-molded by a roll pressing machine to form the cathode active material layer 161B. After that, the cathode lead 164 made of aluminum was welded and attached to an end of the cathode current collector 161A.

Next, the anode 162 was formed. Specifically, the anode current collector 162A (thickness: 20 μm, ten points average height of roughness profile Rz: 3.5 μm) made of an electrolytic copper foil was prepared. After that, silicon as an anode active material was deposited on the both faces of the anode current collector 162A by electron beam evaporation method by using the evaporation apparatus in FIG. 1 described in the foregoing embodiment. Thereby, the anode active material particles were formed into a single layer structure to obtain the anode active material layer 162B. At that time, silicon with the purity of 99% was used as an evaporation source, the deposition rate was 6 μm·/min (deposition rate of the anode active material layer 162B being 6 μm thick where the running rate of the anode current collector 162A is 1 m/min), and the oxygen content in the anode active material particle was 3 atomic %. Further, the anode active material layer 162B was formed while continuously introducing oxygen gas into the evaporation treatment bath 2. The heat shield plates 5A and 5B made of copper having water cooling mechanism were used. After that, the anode lead 165 made of nickel was welded and attached to one end of the anode current collector 162A.

Subsequently, the separator 163 made of a microporous polyethylene film being 16 μm thick was prepared. Then, the cathode 161, the separator 163, the anode 162, and the separator 163 were layered sequentially to form a laminated body. The resultant laminated body was spirally wound several times, and thereby the spirally wound electrode body 160 was formed. The obtained spirally wound electrode body 160 was shaped into a flat shape.

Next, the flat-shaped spirally wound electrode body 160 was contained in the package can 151. After that, the insulating plate 152 was arranged on the spirally wound electrode body 160. The anode lead 165 was welded to the package can 151, the cathode lead 164 was welded to the lower end of the cathode pin 155, and the battery cover 153 was fixed on the open end of the package can 151 by laser welding. After that, an electrolytic solution was injected into the package can 151 through the electrolytic solution injection hole 159. As the electrolytic solution, an electrolytic solution obtained by dissolving $LiPF_6$ as an electrolyte salt at a concentration of 1 mol/dm$^3$ into a mixed solvent of 30 wt % of ethylene carbonate (EC), 60 wt % of diethyl carbonate (DEC), and 10 wt % of difluoroethylene carbonate (DFEC) was used. Finally, the electrolytic solution injection hole 159 was sealed by the sealing member 159A, and thereby a square type secondary battery was obtained.

Comparative Examples 1 to 3

Each secondary battery of Comparative examples 1 to 3 was fabricated in the same manner as that of Example 1, except that the heat shield plate was not used when the anode active material layer 162B was formed. In Comparative example 1, both the deposition rate of the anode active material layer 162B and the running rate of the anode current collector 162A were the same as those in Example 1. In Comparative example 2, the deposition rate of the anode active material layer 162B was half of that in Example 1, but the running rate of the anode current collector 162A was the same as that in Example 1. In Comparative example 3, the deposition rate of the anode active material layer 162B was half of that in Example 1, and the running rate of the anode current collector 162A was twice as much as that in Example 1.

For the secondary batteries of Example 1 and Comparative examples 1 to 3, the cycle characteristics were examined, and the state of the anode active material layer 162B was examined. The results are shown in Table 1. In Table 1, the deposition rate and the running rate are shown as values normalized on the values of Example 1.

TABLE 1

|  | Deposition rate | Running rate | Discharge capacity retention ratio (%) | State of active material layer |
|---|---|---|---|---|
| Example 1 | 1 | 1 | 75 | Good |
| Comparative example 1 | 1 | 1 | Unmeasurable | Copper dissolved |
| Comparative example 2 | 0.5 | 1 | Unmeasurable | Part of copper dissolved |
| Comparative example 3 | 0.5 | 2 | <30 | Intermetallic compound formed |

When the cycle characteristics were examined, a cycle test was performed by the following procedure and thereby the discharge capacity retention ratio was obtained. First, to stable the battery state, charge and discharge were performed 1 cycle in the atmosphere at 25 deg C., and then charge and discharge were performed again to measure the discharge capacity at the second cycle. Subsequently, charge and discharge were performed 99 cycles in the same atmosphere to measure the discharge capacity at the 101st cycle. Finally, the discharge capacity retention ratio (%)=(discharge capacity at the 101st cycle/discharge capacity at the second cycle)×100 was calculated. For the first cycle, first, charge was performed at the constant current density of 0.2 mA/cm$^2$ until the battery voltage reached 4.2 V, charge was continuously performed at the constant voltage of 4.2 V until the current density reached 0.05 mA/cm$^2$, and discharge was performed at the constant current density of 0.2 mA/cm$^2$ until the battery voltage reached 2.5 V. For each cycle on and after the second cycle, first, charge was performed at the constant current density of 2 mA/cm$^2$ until the battery voltage reached 4.2 V, charge was continuously performed at the constant voltage of 4.2 V until the current density reached 0.1 mA/cm$^2$, and discharge was performed at the constant current density of 2 mA/cm$^2$ until the battery voltage reached 2.5 V.

For the state of the anode active material layer 162B, the surface or a cross section thereof were observed by a scanning electron microscope (SEM). FIGS. 11A to 14B show SEM images (secondary electron images). FIGS. 11A, 12A, 13A, and 14A are SEM images. FIGS. 11B, 12B, 13B, and 14B schematically show the SEM images shown in FIGS. 11A, 12A, 13A, and 14A.

Figure 11A:
FIGS. 11A and 11B are an SEM image showing a surface of an anode according to Example 1 and a schematic view thereof.
Figure 11B:
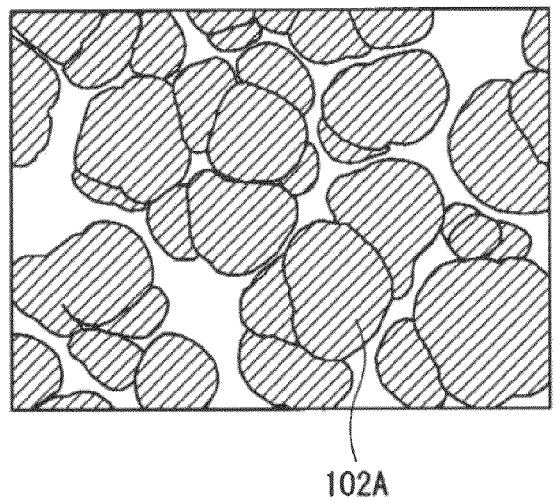

As shown in FIGS. 11A and 11B, in Example 1, it was confirmed that the anode active material layer 162B was formed from a plurality of anode active material particles 102A made of silicon. In this case, as shown in FIG. 1, the high discharge capacity retention ratio of 75% was obtained.

Figure 12A:
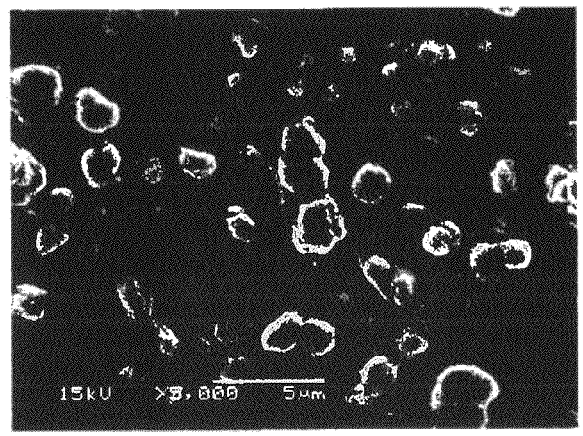
FIGS. 12A and 12B are an SEM image showing a surface of an anode according to Comparative example 1 and a schematic view thereof.
Figure 12B:
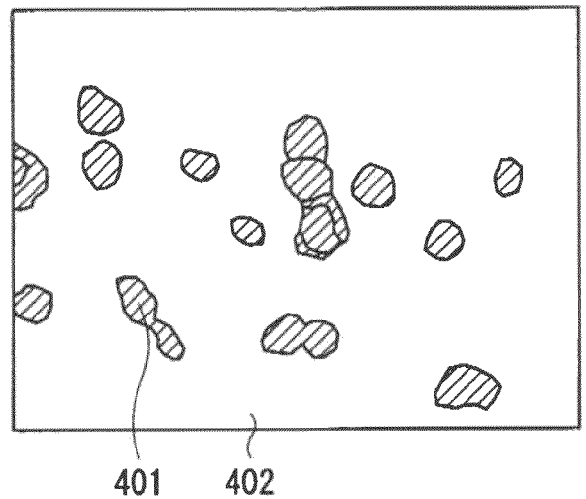

Meanwhile, in Comparative example 1, in spite of the same deposition rate and the running rate as in Example 1, copper composing the anode current collector 162A was dissolved by radiation heat of the evaporation source, and the anode active material layer 162B was hardly formed. As shown in FIGS. 12A and 12B, particles 401 containing silicon were slightly recognized on the surface of the anode current collector 162A. However, most of the particles 401 became a melted portion 402 composed of melted and solidified copper and silicon. Therefore, the discharge capacity retention ratio was not able to be measured.

Figure 13A:
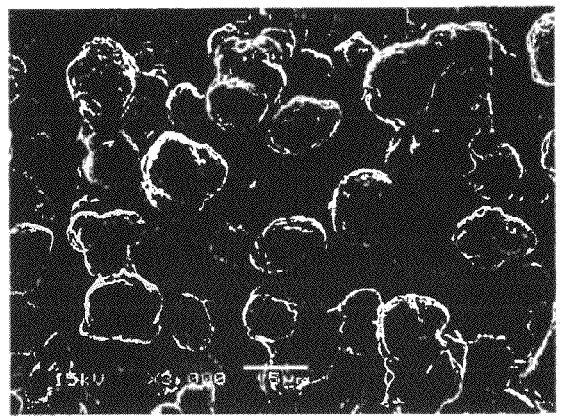
FIGS. 13A and 13B are an SEM image showing a surface of an anode according to Comparative example 2 and a schematic view thereof.
Figure 13B:
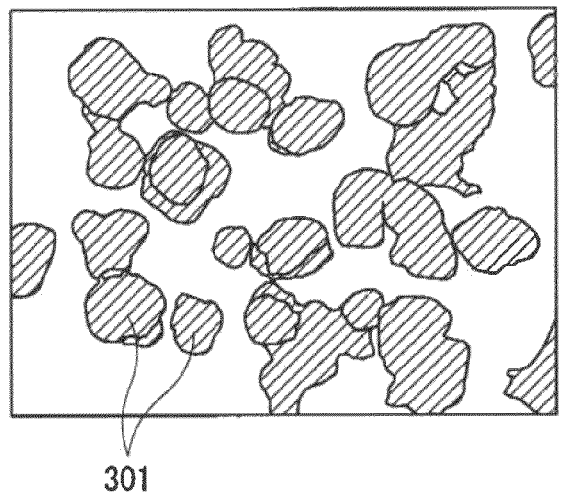

In Comparative example 2, influence of the radiation heat of the evaporation source was reduced than in Comparative example 1. However, a high quality anode active material layer was not able to be formed, and the discharge capacity retention ratio was not able to be measured. In Comparative example 2, as shown in FIGS. 13A and 13B, particles 301 containing silicon were recognized. However, part of copper composing the anode current collector 162A was melted and mixed in the particle 301.

Figure 14A:
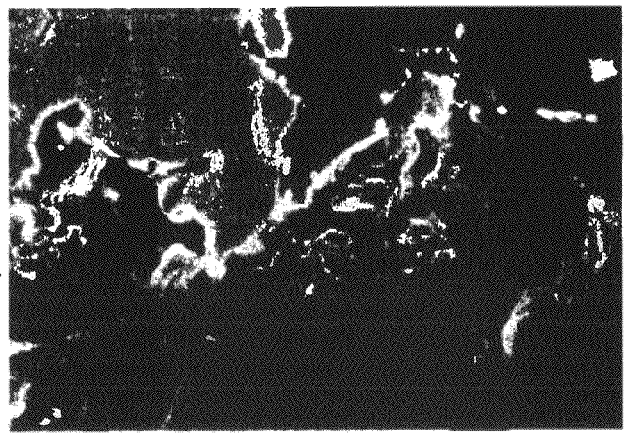
FIGS. 14A and 14B are an SEM image showing a surface of an anode according to Comparative example 3 and a schematic view thereof.
Figure 14B:
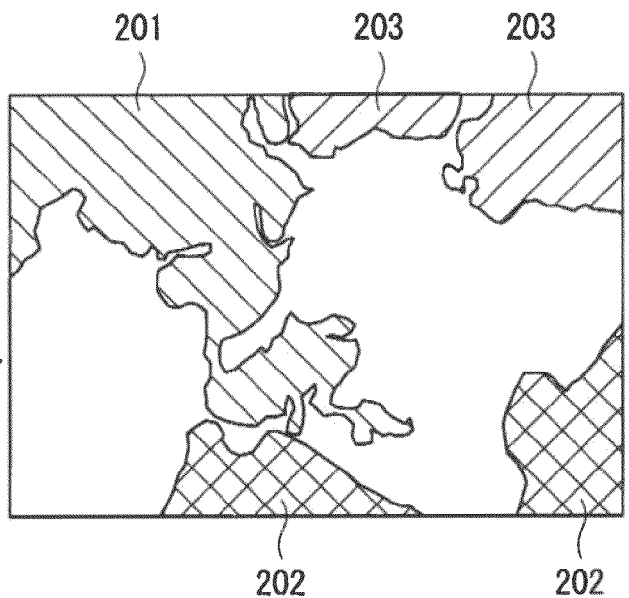

In Comparative example 3, influence of the radiation heat of the evaporation source was reduced than in Comparative example 2. However, the discharge capacity retention ratio was significantly low as under 30%. In Comparative example 3, as shown in FIGS. 14A and 14B, anode active material particles 203 composed of silicon were recognized. However, it was confirmed that an intermetallic compound 201 composed of Cu$_3$Si was generated. It is conceivable that such an intermetallic compound 201 adversely affected the discharge capacity retention ratio. The portion affixed with referential number 202 represents copper composing the anode current collector 162A.

As described above, it was confirmed that to form the high quality anode active material layer 162B on the anode current collector 162A by using vacuum evaporation method and to obtain the high discharge capacity retention ratio, it was extremely effective to decrease the radiation heat of the evaporation sources 3A and 3B to the anode current collector 162A by the heat shield plates 5A and 5B. That is, it was found that by providing the heat shield plates 5A and 5B near the evaporation source 3A and 3B between the evaporation sources 3A and 3B and the anode current collector 162A, the temperature of the anode current collector 162A itself was inhibited from being excessively increased, alteration of the anode active material layer 162B and unnecessary side reaction between the active material layer 162B and the anode current collector 162A was avoided, and both improvement of the discharge capacity retention ratio and improvement of production efficiency were achieved.

The invention has been described with reference to the embodiment and the example. However, the invention is not limited to the foregoing embodiment and the foregoing example, and various modifications may be made. For example, in the foregoing embodiment and the foregoing example, the metal foil made of copper, nickel, or aluminum has been exemplified as an evaporation object, and the descriptions have been given of the case using the evaporation apparatus when the thin film is formed on the metal foil. However, the invention is not limited to such a mode. For example, the evaporation apparatus of the invention may be used for a case where instead of the metal foil, a plastic film is used as an evaporation object, and a thin film made of a given material is formed on the plastic film.

Further, in the foregoing embodiment and the foregoing example, as an evaporation apparatus of the invention, the descriptions have been given of the electron beam evaporation apparatus for heating by radiating an electron beam in the evaporation source as an example. However, the evaporation apparatus of the invention is not limited thereto. For example, a vacuum evaporation apparatus including an evaporation source using resistance heating may be used.

Further, in the foregoing embodiment and the foregoing example, the descriptions have been given of the lithium ion secondary battery in which the anode capacity is expressed by the capacity component based on insertion and extraction of lithium as a battery type. However, the battery type of the invention is not limited thereto. The invention is similarly applicable to a secondary battery in which the anode capacity includes the capacity component based on insertion and extraction of lithium and the capacity component based on precipitation and dissolution of lithium, and the anode capacity is expressed by the sum of these capacity components, by setting the charge capacity of the anode material capable of inserting and extracting lithium to a smaller value than the charge capacity of the cathode.

Further, in the foregoing embodiment and the foregoing example, the description has been given of the case using lithium as an electrode reactant. However, as an electrode reactant, other Group 1 element such as sodium (Na) and potassium (K), a Group 2 element such as magnesium (Mg) and calcium (Ca), or other light metal such as aluminum may be used. In these cases, the anode material described in the foregoing embodiment may be used as an anode active material as well.

Further, in the foregoing embodiment and the foregoing example, the description has been given of the case where the anode is manufactured by using the evaporation apparatus of the invention. However, the evaporation apparatus of the invention is applicable to the case of manufacturing the cathode. In this case, it is possible that the cathode used for a primary battery or a secondary battery is manufactured by forming a cathode active material layer containing, as an active material, for example, $Cr_3O_8$, FeO, $Fe_2O_3$, $Fe_3O_4$, CoO, $Co_3O_4$, NiO, $Mn_3O_4$, ZnO, $MoO_3$, CuS, NiS, $Ti_2S$, $MoS_3$, FeS, $NiF_2$, $CuF_2$, $CoF_2$, $CoF_3$, $FeF_2$ and the like in addition to the active materials cited in the foregoing embodiment and the foregoing example on a cathode current collector.

It should be understood by those skilled in the art that various modifications, combinations, sub-combinations and alternations may occur depending on design requirements and other factors insofar as they are within the scope of the appended claims or the equivalents thereof.

What is claimed is:

1. A method of manufacturing an anode in which an active material layer is provided on a current collector, comprising:
   retaining the current collector in a location where the current collector is sequentially opposed to two evaporation sources in series discharging active materials by heating; and
   forming the active material layer by sublimating the active materials from the evaporation sources after arranging a heat shield member including two openings each in a location closer to one of the evaporation sources than to the current collector between the evaporation sources and the current collector, the evaporation sources being separated in two chambers that are separated from one another by a wall that intersects the heat shield member, and depositing the active materials in a vapor phase passing through the openings on the current collector while blocking part of radiation heat of the evaporation sources by the heat shield member.

2. The method of manufacturing an anode according to claim 1, wherein,
   each evaporation source in which the active material is contained in a depressed portion of a container is used, and
   the heat shield member is arranged so that the entire container is concealed from the current collector.

3. The method of manufacturing an anode according to claim 1, wherein the active material is evaporated while the current collector runs by making a rotating body retain the current collector and rotating the rotating body.

4. The method of manufacturing an anode according to claim 1, wherein copper (Cu) is used as the current collector, and silicon (Si) is used as a main element of the active material.

5. A method of manufacturing a battery comprising:
   respectively forming a cathode and an anode; and
   containing a laminated structure including the cathode, the anode, and a separator sandwiched between the cathode and the anode into a package member together with an electrolyte, wherein,
   the forming the anode includes:
   retaining a current collector in a location where the current collector is sequentially opposed to two evaporation sources in series discharging active materials by heating; and
   forming an active material layer by sublimating the active materials from the evaporation sources after arranging a heat shield member including two openings each in a location closer to one of the evaporation sources than to the current collector between the evaporation sources and the current collector, the evaporation sources being separated in two chambers that are separated from one another by a wall that intersects the heat shield member, and depositing the active materials in a vapor phase passing through the openings on the current collector while blocking part of radiation heat of the evaporation sources by the heat shield member.

6. The method of manufacturing an anode according to claim 1, wherein, the forming the active material layer includes running the current collector past the openings in both forward and reverse directions while depositing the active materials.

7. The method of manufacturing a battery according to claim 5, wherein, the forming the active material layer includes running the current collector past the openings in both forward and reverse directions while depositing the active materials.

8. The method of manufacturing an anode according to claim 1, wherein, the forming the active material layer includes sublimating the active materials from the evaporation sources that are separated in two chambers, the two chambers being separated from one another by the wall that intersects the heat shield member, where the wall is a vertical wall.

9. The method of manufacturing a battery according to claim 5, wherein, the forming the active material layer includes sublimating the active materials from the evaporation sources that are separated in two chambers, the two chambers being separated from one another by the wall that intersects the heat shield member, where the wall is a vertical wall.

10. The method of manufacturing an anode according to claim 1, wherein, the forming the active material layer includes arranging the heat shield member so that each opening includes a cross sectional area smaller than a cross sectional area of active material in one of the evaporation sources.

11. The method of manufacturing a battery according to claim 5, wherein, the forming the active material layer includes arranging the heat shield member so that each opening includes a cross sectional area smaller than a cross sectional area of active material in one of the evaporation sources.

* * * * *